United States Patent
Isogai et al.

(10) Patent No.: US 8,581,315 B2
(45) Date of Patent: Nov. 12, 2013

(54) SEMICONDUCTOR DEVICE HAVING CYLINDRICAL LOWER ELECTRODE OF CAPACITOR AND MANUFACTURING METHOD THEREOF

(75) Inventors: Satoru Isogai, Tokyo (JP); Takahiro Kumauchi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 116 days.

(21) Appl. No.: 13/366,391

(22) Filed: Feb. 6, 2012

(65) Prior Publication Data

US 2013/0032924 A1 Feb. 7, 2013

Related U.S. Application Data

(63) Continuation of application No. 12/647,187, filed on Dec. 24, 2009, now Pat. No. 8,138,536.

(30) Foreign Application Priority Data

Dec. 24, 2008 (JP) .................................. 2008-328519

(51) Int. Cl.
*H01L 21/108* (2006.01)

(52) U.S. Cl.
USPC .......... 257/296; 257/303; 257/306; 257/532; 257/E29.343; 257/E21.011

(58) Field of Classification Search
USPC ........................... 257/532, E21.011, E29.343
See application file for complete search history.

(56) References Cited

U.S. PATENT DOCUMENTS

| | | |
|---|---|---|
| 6,822,280 B2 | 11/2004 | Ito et al. |
| 7,026,208 B2 | 4/2006 | Park et al. |
| 2004/0051130 A1 | 3/2004 | Miyajima |
| 2006/0086952 A1 | 4/2006 | Kim et al. |
| 2006/0183297 A1 | 8/2006 | Mun et al. |
| 2009/0014833 A1 | 1/2009 | Yoon et al. |
| 2009/0068814 A1 | 3/2009 | Cho et al. |
| 2009/0102017 A1 | 4/2009 | Bae et al. |

FOREIGN PATENT DOCUMENTS

| | | |
|---|---|---|
| JP | 2003-142605 | 5/2003 |
| JP | 2003-297952 | 10/2003 |

*Primary Examiner* — Mamadou Diallo
(74) *Attorney, Agent, or Firm* — Young & Thompson

(57) ABSTRACT

To provide a semiconductor device including: plural capacitors each including a cylindrical lower electrode having an internal wall and an external wall, and an upper electrode that covers the external wall of the lower electrode via a capacitance dielectric film; and a supporting film having a buried portion buried in an internal region surrounded by the internal wall of the lower electrode, and a supporting portion a part of which is positioned within the internal region and remaining parts of which are positioned at outside of the internal region. The supporting portion sandwiches an upper end of the lower electrode at both ends of the upper end by covering the internal wall and the external wall of the upper end of the lower electrode.

20 Claims, 23 Drawing Sheets

SEMICONDUCTOR DEVICE HAVING CYLINDRICAL LOWER ELECTRODE OF CAPACITOR AND MANUFACTURING METHOD THEREOF

CROSS REFERENCE TO RELATED APPLICATIONS

This application is a continuation of co-pending application Ser. No. 12/647,187 filed on Dec. 24, 2009, which claims foreign priority to Japanese patent application 2008-328519 filed Dec. 24, 2008. The entire content of each of these applications is hereby expressly incorporated by reference.

BACKGROUND OF THE INVENTION

1. Field of the Invention

The present invention relates to a semiconductor device and a manufacturing method thereof, and more particularly relates to a semiconductor device having a cylindrical lower electrode of a capacitor within a memory, and a manufacturing method of the semiconductor device.

2. Description of Related Art

Along with the development of downscaling of semiconductor devices, an area of a memory cell constituting a DRAM (Dynamic Random Access Memory) element is downsized. Therefore, an occupied area of a capacitor constituting the memory cell is limited, and securing of an electrostatic capacitance proportionate to an electrode area becomes difficult.

Regarding this problem, to sufficiently secure an electrode area, a technique of three-dimensionally forming a capacitor has been known (see, for example, Japanese Patent Application Laid-open Nos. 2003-297952 and 2003-142605). According to this conventional technique, a lower electrode of a capacitor is formed in a cylindrical shape, and an upper electrode is arranged at outside of the lower electrode via an insulator. With this arrangement, a sufficient electrode area can be secured in a small occupied area.

A step of manufacturing a capacitor includes formation of a lower electrode on an internal wall of openings formed in an insulator, removing of the insulator, and exposing of an external wall of the lower electrode. In this case, because of absence of a material that supports the lower electrode, there sometimes occurs a phenomenon (collapse phenomenon) that the lower electrode is broken and is contacted to a lower electrode of other adjacent capacitors, thereby causing short-circuit. Particularly, when an internal diameter of a lower electrode is made small to decrease the area of a memory cell or when a height of a lower electrode is increased to secure the electrode area, the collapse phenomenon occurs easily. In Japanese Patent Application Laid-open Nos. 2003-297952 and 2003-142605, to suppress the occurrence of the collapse phenomenon, a supporting film is arranged between the adjacent lower electrodes.

However, according to the above conventional supporting film, particularly when the lower electrode has a certain height or a larger height, connection strength between a buried portion and a supporting portion becomes insufficient, and thus the effect of suppressing the occurrence of the collapse phenomenon cannot be sufficiently achieved. That is, at the time of etching to remove the insulation film, the supporting film is also gradually etched, instead of not being etched at all. Therefore, the connection strength becomes weak. Further, because it takes a long etching time when the lower electrode becomes higher, the connection strength becomes conspicuously weaker as the lower electrode becomes higher.

Therefore, there has been a demand for a technique for sufficiently achieving suppression of the occurrence of the collapse phenomenon even when the height of a lower electrode is increased.

SUMMARY

The present invention seeks to solve one or more of the above problems, or to improve upon those problems at least in part.

In one embodiment, there is provided a semiconductor device that includes a plurality of capacitors each including a cylindrical lower electrode having an internal wall and an external wall, and an upper electrode disposed facing to the external wall of the lower electrode with an intervention of a dielectric film therebetween; and a supporting film having a buried portion filled into a center region of the cylindrical lower electrode such as surrounded by the internal wall of the lower electrode, and a supporting portion a part of which is positioned within the cylindrical lower electrode and a remaining part of which is positioned at outside of the cylindrical lower electrode, wherein the supporting portion sandwiches an upper end region of the lower electrode by contacting to the internal wall and the external wall of the lower electrode.

In another embodiment, there is provided a manufacturing method of a semiconductor device that includes forming a plurality of openings in an insulation film; forming a cylindrical lower electrode in each of the openings, the cylindrical lower electrode having an internal wall and an external wall; etching a part of the insulation film so as to project an upper end region of the lower electrode from a surface of the insulation film, thereby exposing the external wall of the upper end region of the lower electrode; forming a supporting film that connects to at least a part of the internal wall and a part of the external wall at the upper end region of the lower electrode; removing the insulation film; forming a dielectric film that covers an exposed surface of the lower electrode; and forming an upper electrode such as facing to the lower electrode with an intervention of the dielectric film therebetween.

In still another embodiment, there is provided a manufacturing method of a semiconductor device that includes forming a first supporting film on an upper surface of an insulation film; forming a plurality of openings that penetrates the first supporting film and the insulation film; forming a cylindrical lower electrode in each of the openings, the cylindrical lower electrode having an internal wall and an external wall; forming a second supporting film on the first supporting film and the internal wall of the lower electrode; removing the insulation film; and forming a dielectric film that covers an exposed surface of the lower electrode; and forming an upper electrode such as facing to the lower electrode with an intervention of the dielectric film therebetween.

As described above, according to the present invention, because the supporting film sandwiches the upper end of the lower electrode at both sides of the upper end, a state of strong connection between the buried portion and the supporting portion can be maintained even when wet etching is performed. Therefore, even when the cylindrical lower electrode is higher, the effect of suppressing the occurrence of the collapse phenomenon can be sufficiently obtained.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will be explained below in detail with reference to the accompanying drawings.

Figure 1:
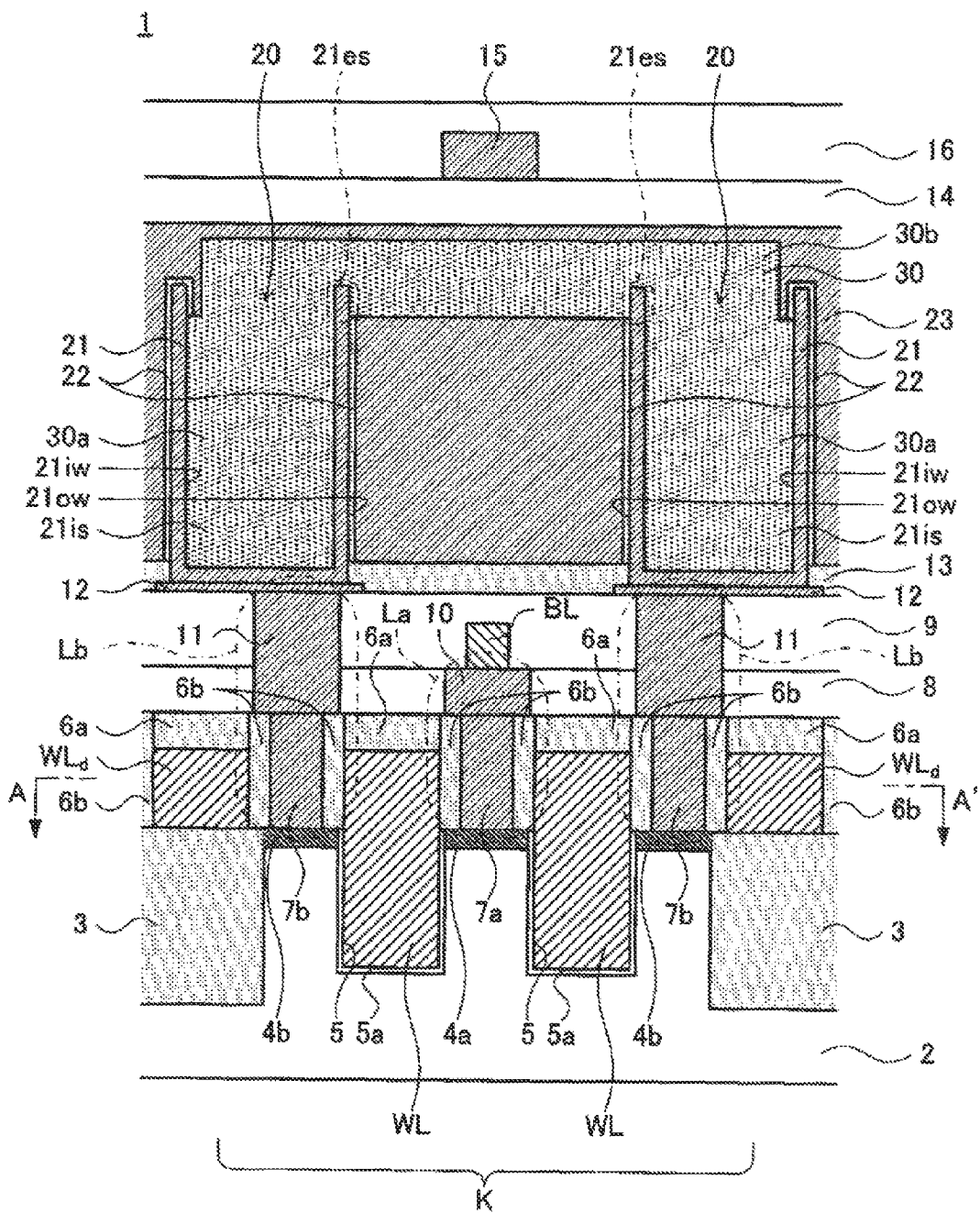
FIG. 1 is a cross-sectional view of a semiconductor device 1 according to a first embodiment of the present invention.

FIG. 1 is a cross-sectional view of a semiconductor device 1 according to a first embodiment of the present invention. The semiconductor device 1 is a DRAM (Dynamic Random Access Memory).

As shown in FIG. 1, the semiconductor device 1 has a semiconductor substrate 2 made of silicon (Si) having P-type impurity in predetermined concentration. Plural element isolation regions 3 configured by an insulation film such as a silicon oxide ($SiO_2$) film are embedded in the semiconductor substrate 2. The element isolation regions 3 achieve dielectric isolation by STI (Shallow Trench Isolation). A region (an active region K) sandwiched by the element isolation regions 3 is dielectrically isolated from adjacent active regions K (shown in FIG. 2 described later). The semiconductor device 1 has two memory cells within one active region K.

Diffusion layers 4a and 4b of N-type impurity are provided on a surface of the semiconductor substrate 2, at a center and at both ends within the active region K. A trench 5 having an insulation film 5a formed on a surface is provided between the diffusion layer 4a at the center and the diffusion layers 4b at both ends, respectively. A word line WL is embedded in each trench 5. The word line WL is formed by a multilayer film of a polycrystalline silicon film and a metal film, and an upper part is stretched from an upper surface of the semiconductor substrate 2. A dummy word line $WL_d$ is formed at an upper side of each element isolation region 3.

An insulation film 6a configured by an insulator such as silicon nitride ($Si_3N_4$) is formed on an upper surface of each word line WL and each dummy word line WL_d. A sidewall insulation film 6b configured by an insulator such as silicon nitride is formed on a portion stretched from the upper surface of the semiconductor substrate 2 of each word line WL, on a side surface of each dummy word line WL_d, and on a side surface of each insulation film 6a.

A substrate contact plug 7a configured by a conductor such as polycrystalline silicon containing phosphorus is provided between the word lines WL. Similarly, a substrate contact plug 7b configured by a conductor such as polycrystalline silicon containing phosphorus is provided between each word line WL and each dummy word line WL_d. A lower surface of each of the substrate contact plugs 7a and 7b is in contact with an upper surface of each of the diffusion layers 4a and 4b, respectively.

Upper surfaces of the insulation films 6a and 6b and the contact plugs 7a and 7b are configured flat. A first interlayer insulating film 8 is formed on each upper surface. A bit line BL configured by a laminated film of tungsten nitride (WL) and tungsten (W) is formed above the substrate contact plug 7a, on the first interlayer insulating film 8. A second interlayer insulating film 9 is formed to cover the bit line BL, on an entire upper surface of the first interlayer insulating film 8.

Figure 2:
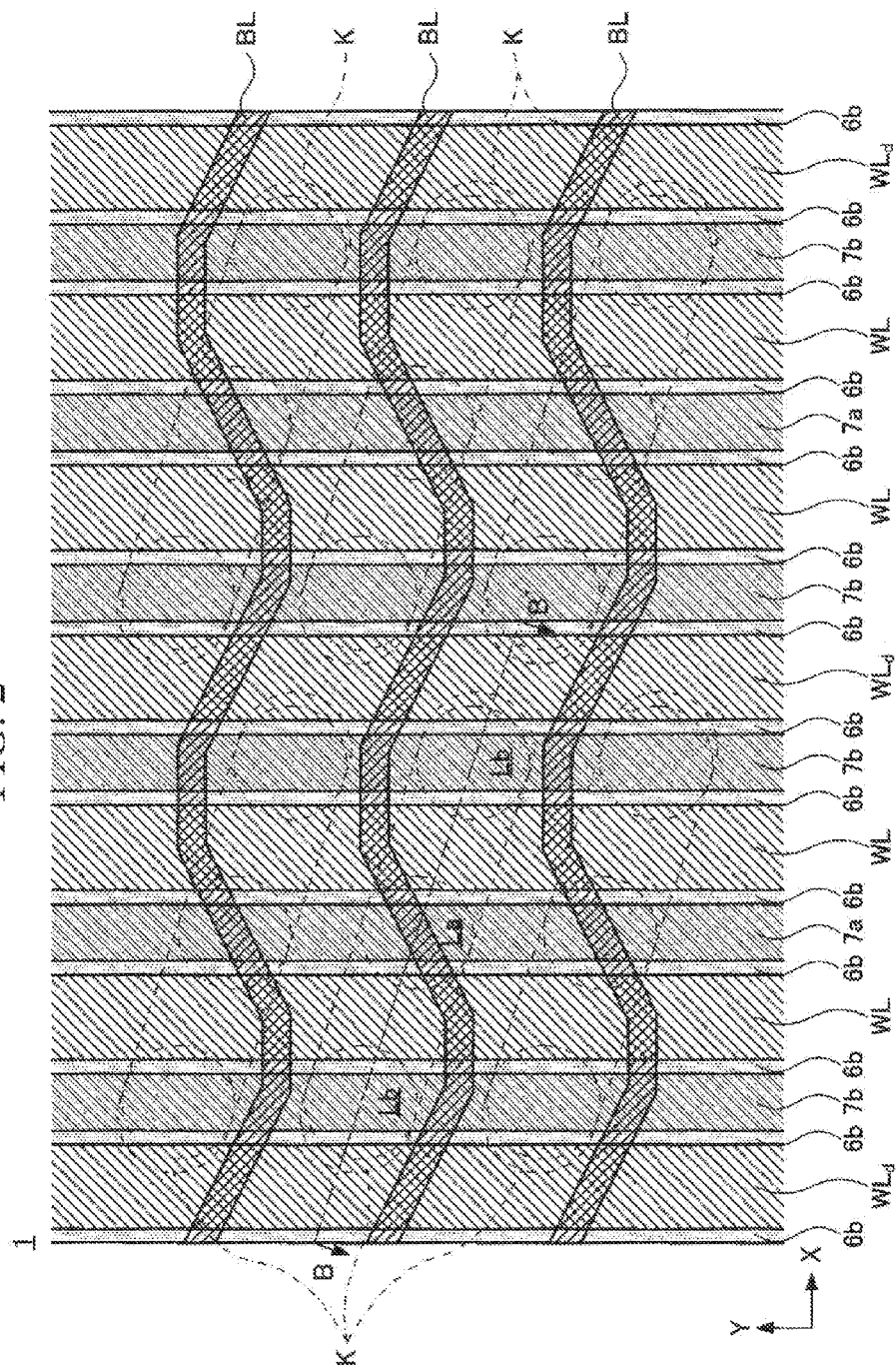
FIG. 2 is a schematic diagram showing an outline of a plane structure of the semiconductor device according to a first embodiment of the present invention.

A plane structure of the semiconductor device 1 is explained below. FIG. 2 is a schematic diagram showing an outline of a plane structure of the semiconductor device 1. FIG. 2 is a plan view containing a cross-sectional surface along a line A-A' in FIG. 1, added with the bit lines BL and the active regions K. FIG. 1 corresponds to across-sectional view along a line B-B' in FIG. 2.

As shown in FIG. 2, the bit lines BL and the word lines WL are extended to directions orthogonal with each other. Plural bit lines BL are arranged at a predetermined interval in a Y direction shown in FIG. 2, and each bit line BL is extended to an X direction in a broken-line shape (a curved shape). On the other hand, plural word lines WL are arranged at a predetermined interval in the X direction shown in FIG. 2. The word lines WL are replaced by the dummy word lines WL_d at every two lines. Each word line WL and each dummy word line WL_d are extended to the Y direction in a straight line shape.

The active region K is a slender strip region, and is arranged to stride two adjacent word lines WL. The active region K is provided in a tilted manner to the X direction so that the active region K and the bit line BL cross each other near the center of the active region K. Many active regions K are arranged at a predetermined interval in the X direction and the Y direction. Adjacent active regions K are dielectrically isolated by the above-described element isolation regions 3.

The active regions K are not limited to be arranged in a shape as shown in FIG. 2. For example, the present invention can be also applied to active regions arranged in a shape applied to a general transistor.

Referring back to FIG. 1, a through-hole is provided at a position corresponding to the substrate contact plug 7a, on the first interlayer insulating film 8. A bit-line contact plug 10 configured by a laminated film having tungsten (W) or the like laminated on a barrier film (Tin/Ti) made of a laminated film of titanium (Ti) and titanium nitride (TiN) is embedded in the through-hole. An upper surface of the bit-line contact plug 10 is contacted and conductive to the bit line BL, and a lower surface of the bit-line contact plug 10 is contacted and conductive to the substrate contact plug 7a. With this arrangement, the bit line BL and the diffusion layer 4a are conductive to each other, and the substrate contact plug 7a and the bit-line contact plug 10 function as a substrate contact La to connect the bit line BL and the semiconductor substrate 2 to each other.

A through-hole is provided at a position corresponding to each substrate contact plug 7b, on each of the interlayer insulation films 8 and 9, and a capacitance contact plug 11 is embedded in each of the interlayer insulation films 8 and 9. The capacitance contact plug 11 is also configured by a laminated film having tungsten or the like laminated on a barrier film made of a laminated film of titanium and titanium nitride. A capacitance contact pad 12 configured by a laminated film of tungsten nitride (WN) and tungsten is formed at a position corresponding to each capacitance contact plug 11, on an upper surface of the second interlayer insulating film 9. An upper surface of the capacitance contact plug 11 is contacted and conductive to a corresponding one of the capacitance contact pads 12, and a lower surface of the capacitance contact plug 11 is contacted and conductive to a corresponding one of the substrate contact plugs 7b. With this arrangement, the capacitance contact pad 12 and the corresponding diffusion layer 4b are conductive to each other, and the substrate contact plug 7b and the capacitance contact plug 11 function as a substrate contact Lb to connect the capacitance contact pad 12 and the semiconductor substrate 2 to each other.

Referring back to FIG. 2, a plane position of the substrate contacts La and Lb is explained. As shown in FIG. 2, the substrate contact La is provided between two word lines WL at substantially the center of the active region K. On the other hand, the substrate contact Lb is provided between both ends of the active region K, that is, between the word line WL and the dummy word line WL_d.

Referring back to FIG. 1, on an entire upper surface of the second interlayer insulating film 9, a third interlayer insulating film 13 is formed to cover each capacitance contact pad 12. A capacitor 20 having a cylindrical lower electrode 21 is formed on each capacitance contact pad 12. The lower electrode 21 pierces through the third interlayer insulating film 13, and is contacted and conductive to a corresponding one of the capacitance contact pads 12. A height direction of the lower electrode 21 coincides with a laminating direction of the semiconductor device 1. The lower electrode 21 has a cylindrical shape whose lower end (a contact end with the capacitance contact pad 12) is closed. The lower electrode 21 is configured by a metal film of titanium nitride or the like. While the lower electrode 21 has a cylindrical shape, across section on a surface perpendicular to the height direction can take various shapes such as circular and rectangular shapes.

At the outside of the lower electrode 21, there is formed a thin capacitance dielectric film 22 configured by a high dielectric film of hafnium oxide ($HfO_2$), zirconium oxide ($ZrO_2$), aluminum oxide ($Al_2O_3$) or a laminator of these materials. An upper electrode 23 is formed at a further outside. The upper electrode 23 is provided to cover each capacitor 20 and a supporting film 30 described later, on an entire upper surface of the third interlayer insulating film 13. That is, the upper electrode 23 is disposed facing to the external wall of the lower electrode 21 with an intervention of the thin capacitance dielectric film 22 therebetween. The upper electrode 23 is also configured by a metal film of titanium nitride or the like.

The supporting film 30 configured by an insulator such as silicon nitride is filled into an internal region 21is (a center region of the cylindrical lower electrode 21) such as surrounded by an internal wall 21iw of the lower electrode 21 (a buried portion 30a). The supporting film 30 further has a supporting portion 30b a part of which is positioned within the internal region 21is (the cylindrical lower electrode 21), and a remaining part of which is positioned at outside of the internal region 21is (the cylindrical lower electrode 21). The supporting portion 30b is configured integrally with the buried portion 30a, is extended to a predetermined direction, and connects (links) the buried portions 30a of adjacent capacitors 20 to each other. That is, the buried portion 30a and a part of the supporting portion 30b which is positioned within the center region of the cylindrical lower electrode 21 are single-membered. Although not shown in FIG. 1, the supporting portion 30b is extended to an end of the memory cell region. Based on the above configuration, the supporting unit 30b has a function of supporting the lower electrode 21.

The semiconductor device 1 has a specific characteristic in a structure of this supporting portion 30b. That is, as shown in FIG. 1, the supporting portion 30b sandwiches an upper end 21es of the lower electrode 21 at both sides of the upper end region by contacting to the internal wall 21iw and the external wall 21ow of the lower electrode 21. That is, the supporting portion 30b comprises a first supporting film contacting to the external wall 21ow of the upper end region of the lower electrode 21 and a second supporting film contacting to the internal wall 21iw of the upper end region of the lower electrode 21, and the upper end region of the lower electrode 21 is sandwiched by the first supporting film and the second supporting film. With this arrangement, at the time of exposing an external wall of the lower electrode 21 at a wet etching step described later, a state of strong connection between the buried portion 30a and the supporting portion 30b can be maintained. This feature is explained in more detail later when a manufacturing step of the semiconductor device 1 is explained.

Figure 3:
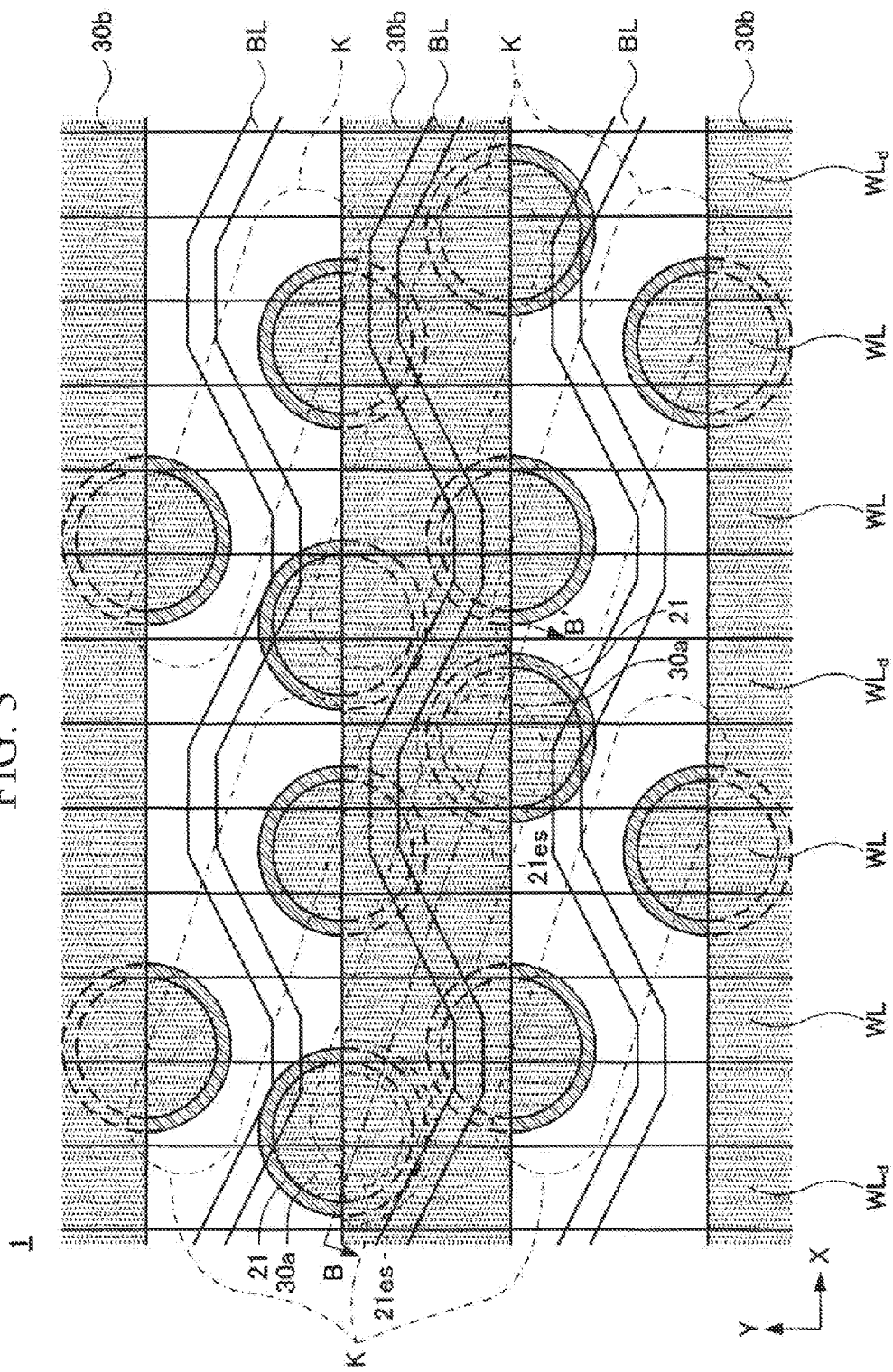
FIG. 3 is a schematic diagram showing an outline of a plane structure of the semiconductor device according to a first embodiment of the present invention.

FIG. 3 is a schematic diagram showing an outline of the plane structure of the semiconductor device 1, like FIG. 2. In FIG. 3, the bit lines BL, the word lines WL (including the dummy word lines $WL_d$), and the active regions K are drawn on a plan view of the lower electrode 21 and the supporting film 30. The upper end 21es of a part of the lower electrodes 21 is also shown.

As shown in FIG. 3, plural supporting portions 30b are arranged at a predetermined interval in the Y direction, like the bit lines BL. Each supporting portion 30b has a straight line shape (a rectangular shape). Each buried portion 30a is circular, and a half of the buried portion 30a is positioned below any one of the supporting portions 30b, and is connected to the supporting portion 30b.

The shape and extending direction of the supporting portion 30b are not limited to the rectangular shape shown in FIG. 3. A half of each buried portion 30a does not need to be exactly connected to the supporting portion 30b, and it is sufficient that at least a part of each buried portion 30a is connected to the supporting portion 30b. An entire upper surface of each buried portion 30a can be connected to the supporting portion 30b, or a shape of a connection surface with the supporting portion 30b can be different for each buried portion 30a. To securely hold the lower electrode 21 of the capacitor by the supporting portion 30b, preferably, the supporting portion 30b and the external wall 21ow are continuously contacted to each other in a circumferential length equal to or larger than one quarter of a circumference (An entire side surface circumference. That is, an entire peripheral length in plan view) of the external wall 21ow of the lower electrode 21.

Although not shown in FIG. 3, the capacitor 20 is formed in only a region where the memory cell is formed. The capacitor 20 is not formed in other region, and an interlayer insulating film (not shown) configured by silicon oxide or the like is formed on the third interlayer insulating film 13.

Referring back to FIG. 1, a fourth interlayer insulating film 14 is formed on an entire upper surface of the upper electrode 23. A wiring layer 15 configured by aluminum (Al) or copper (Cu) is formed on the upper surface of the fourth interlayer insulating film 14. On the entire upper surface of the fourth interlayer insulating film 14, a surface protection film 16 is formed to cover the wiring layer 15.

An operation of the semiconductor device 1 having the above configuration is explained next.

In the semiconductor device 1, the diffusion layers 4a and 4b, the word lines WL, and the insulation film 5a function as MOS transistors. Specifically, the word lines WL function as gate electrodes, the insulation film 5a functions as a gate dielectric film, and the diffusion layers 4a and 4b function as source/drain regions. When one word line WL is activated, an inversion layer occurs within the semiconductor substrate near the activated word line WL, and the corresponding diffusion layers 4a and 4b become conductive to each other. Accordingly, the bit line BL and the capacitor 20 are connected together, and a charge can be exchanged via the bit line BL.

A method of manufacturing the semiconductor device 1 is explained with reference to FIGS. 4 to 14.

Figure 4:
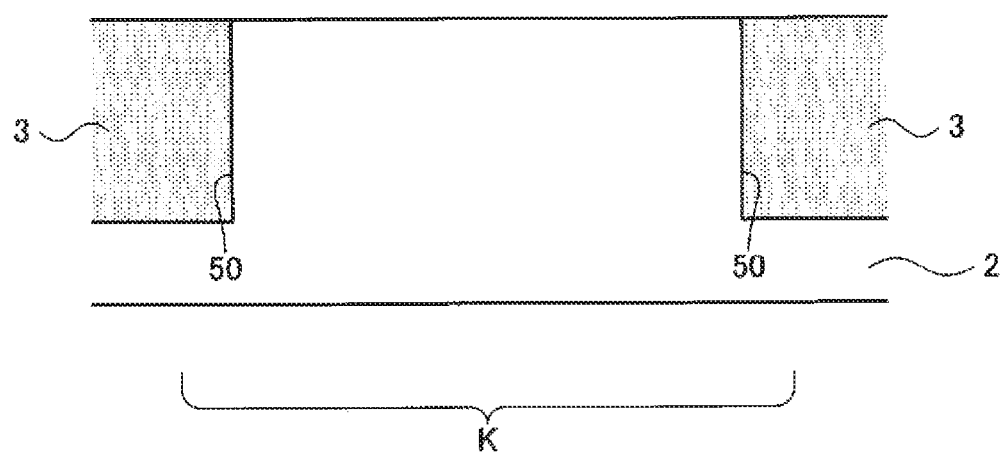
FIG. 4 is a cross-sectional view showing one of steps (forming of element isolation regions 3) of a manufacturing method of a semiconductor device according to a first embodiment of the present invention.

First, as shown in FIG. 4, the semiconductor substrate 2 made of silicon doped with P-type impurity is prepared, and a trench 50 is formed by anisotropic etching. The element isolation region 3 is formed by embedding an insulation film like a silicon oxide film in the trench 50, thereby forming the active region K (the STI method).

Figure 5:
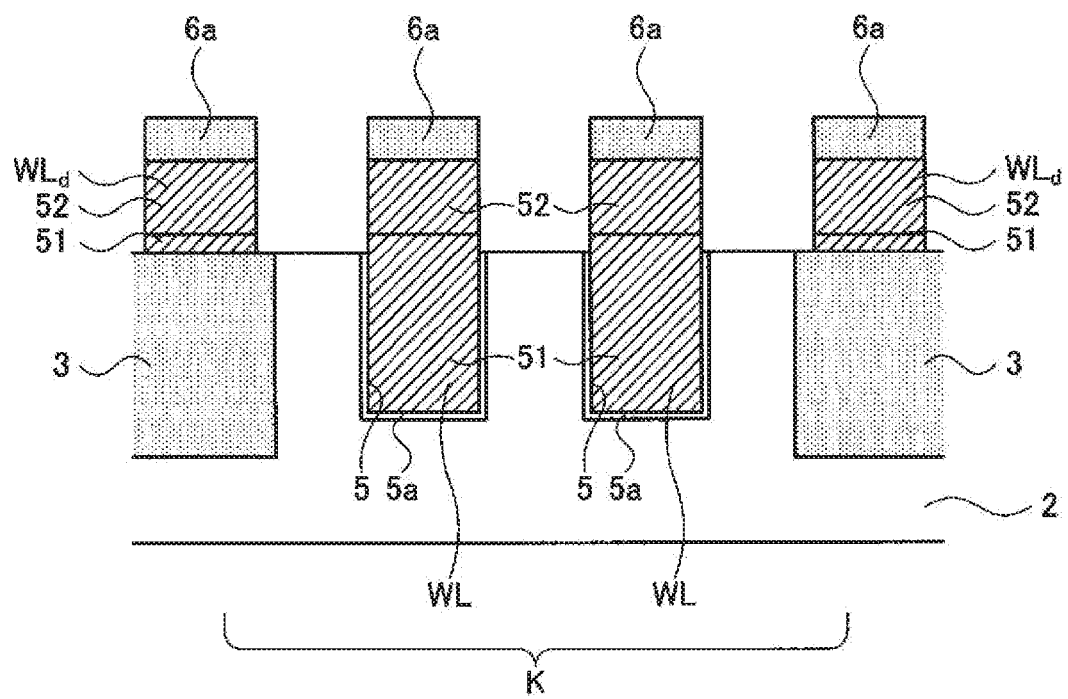
FIG. 5 is a cross-sectional view showing one of steps (from forming trenches 5 to forming word lines WL and dummy word lines $WL_d$) of a manufacturing method of a semiconductor device according to a first embodiment of the present invention.

Next, as shown in FIG. 5, the trench 5 is formed by anisotropic etching using a mask pattern, within the active region K. A silicon surface of the semiconductor substrate 2 is oxidized by a thermal oxidation method, thereby forming the insulation film 5a of silicon oxide on an internal surface of the trench 5. Preferably, the insulation film 5a has a film thickness of about 4 nanometers. A laminated film of silicon oxide and silicon nitride, or a High-K film (a high dielectric film) can be used for the insulation film 5a.

A polycrystalline silicon film 51 containing N-type impurity (such as phosphorus) is deposited within the trench (on the insulation film 5a) by a CVD (Chemical Vapor Deposition) method using monosilane ($SiH_4$) and phoshine ($PH_3$) as raw gases. In this case, the polycrystalline silicon film 51 is set to have a film thickness to allow the inside of the trench 5 to be completely filled. The polycrystalline silicon film 51 deposited can be a film not containing N-type impurity. At a later step, N-type impurity is implanted in the polycrystalline silicon film 51 by using an ion implanting method.

Next, a metal film 52 made of a high melting point metal such as tungsten, tungsten nitride, and tungsten silicide is deposited on the semiconductor substrate 2 by a sputtering method. Preferably, the metal film 52 has a film thickness of about 50 nanometers. The polycrystalline silicon film 51 and the metal film 52 formed as described above are formed on the word lines WL and the dummy word lines $WL_d$ at a later step.

The insulation film 6a made of silicon nitride is deposited on the metal film 52 by a plasma CVD method using monosilane and ammonium ($NH_3$) as raw gases. Preferably, the insulation film 6a has a film thickness of about 70 nanometers.

When the above step is completed, photoresist (not shown) is coated onto the insulation film 6a, and a photoresist pattern (not shown) to form the word lines WL and the dummy word lines $WL_d$ is formed by a photolithography method using a predetermined mask pattern. The insulation film 6a is etched by an anisotropic etching using this photoresist pattern as a mask. When the etching of the insulation film 6a is completed, the photoresist pattern is removed, and the metal film 52 and the polycrystalline silicon film 51 are etched by using the insulation film 6a as a hard mask, thereby forming the word lines WL and the dummy word lines WL$_d$.

Figure 6:
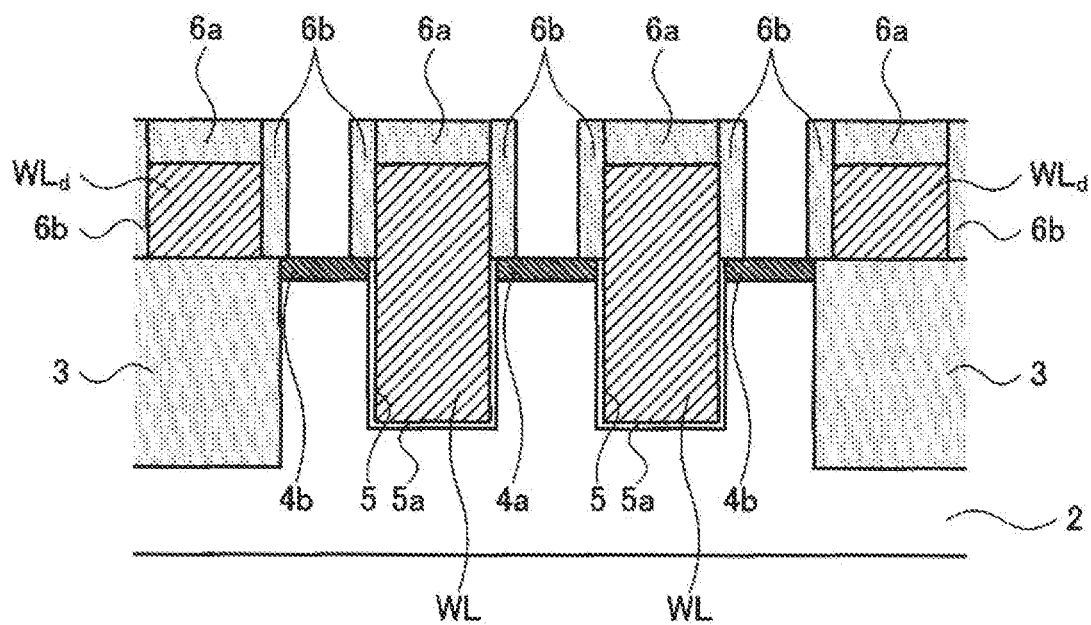
FIG. 6 is a cross-sectional view showing one of steps (from forming impurity diffusion layers 4a and 4b to exposing a upper surface of an insulation film 6a) of a manufacturing method of a semiconductor device according to a first embodiment of the present invention.

Next, as shown in FIG. 6, phosphor as N-type impurity is ion implanted, thereby forming the impurity diffusion layers 4a and 4b on an exposed surface (a surface on which the word lines WL and the dummy word lines WL$_d$ are not formed) of the semiconductor substrate 2. Thereafter, a silicon nitride film is deposited on an entire surface in a film thickness of about 20 to 50 nanometers, by the CVD method. The deposited film is etched back to form the sidewall insulation film 6b on a sidewall of the word lines WL and the dummy word lines WL$_d$.

When the above step is completed, an interlayer insulating film (not shown) made of silicon oxide or the like is deposited to cover the insulation films 6a and 6b, by the CVD method. The interlayer insulating film (not shown) is polished by a CMP (Chemical Mechanical Polishing) method by using the insulation film 6a as a stopper. As a result, an uneven surface generated by the forming steps of the word lines WL and the dummy word lines WL$_d$ is flattened.

Figure 7:
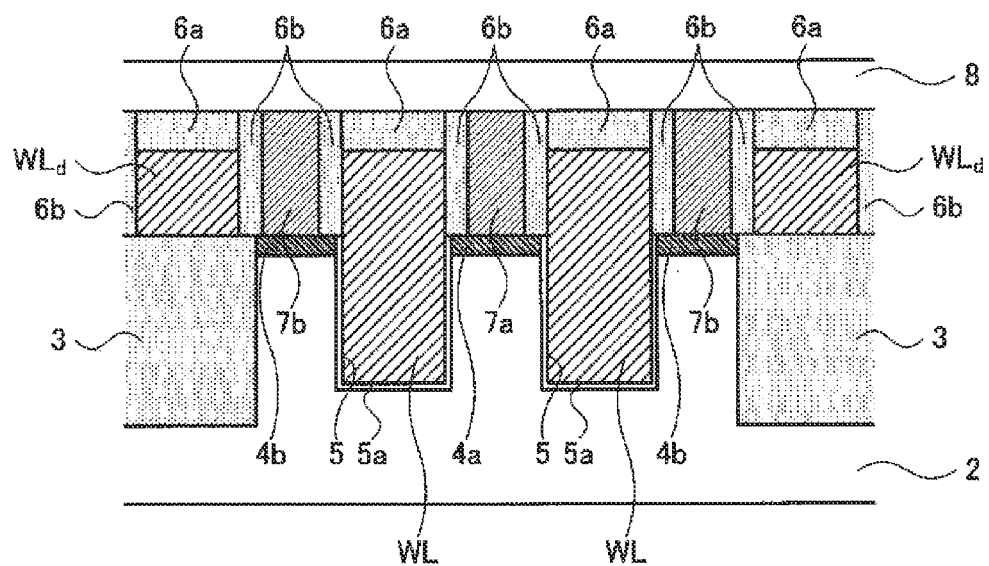
FIG. 7 is a cross-sectional view showing one of steps (from forming substrate contact plugs 7a and 7b to forming a first interlayer insulating film 8) of a manufacturing method of a semiconductor device according to a first embodiment of the present invention.

The substrate contact plugs 7a and 7b are formed as shown in FIG. 7. Specifically, the interlayer insulating film (not shown) deposited at the above step is etched by using as a mask the pattern formed with photoresist. Accordingly, openings are formed at positions where the substrate contact plugs 7a and 7b are to be formed (positions of the substrate contacts La and Lb shown in FIG. 2). These openings can be provided between the word line WL and the dummy word line WL$_d$ by self alignment by using the insulation films 6a and 6b formed with silicon nitride. Thereafter, a polycrystalline silicon film containing phosphorus is deposited by the CVD method, and the deposited film is polished by the CMP method, thereby removing the polycrystalline silicon film deposited on the insulation film 6a. The substrate contact plugs 7a and 7b made of the polycrystalline silicon film buried within the openings are formed by the above steps.

The first interlayer insulating film 8 made of silicon oxide is formed to cover the insulation film 6a and the substrate contact plugs 7a and 7b, by the CVD method. Preferably, the first interlayer insulating film 8 has a film thickness of about 600 nanometers. Thereafter, a surface of the first interlayer insulating film 8 is polished to have a film thickness of about 300 nanometers by the CMP method, thereby flattening the surface.

Figure 8:
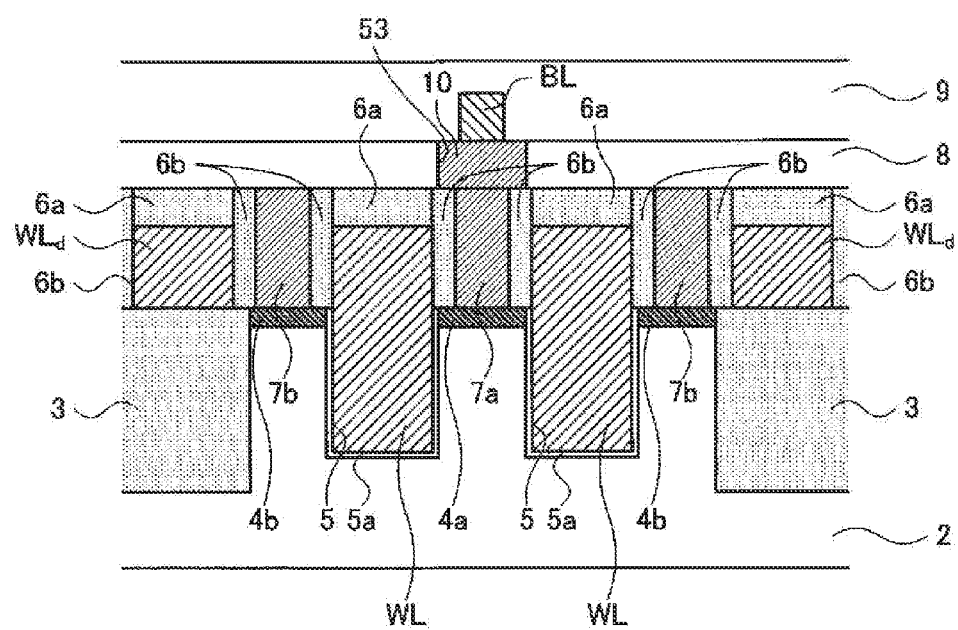
FIG. 8 is a cross-sectional view showing one of steps (from forming openings 53 to forming a second interlayer insulating film 9) of a manufacturing method of a semiconductor device according to a first embodiment of the present invention.

Next, as shown in FIG. 8, an opening (a contact hole) 53 piercing through the first interlayer insulating film 8 is formed at a position of the substrate contact plug 7a (a position of the substrate contact La shown in FIG. 2), thereby exposing a surface of the substrate contact plug 7a. The inside of the opening 53 is filled with a laminated film having a lamination of tungsten or the like on a barrier film made of a laminated film of titanium and titanium nitride, and the surface is polished by the CMP method, thereby forming the bit-line contact plug 10. Thereafter, the bit line BL is formed to be connected to the bit-line contact plug 10. The second interlayer insulating film 9 is formed by silicon oxide or the like to cover the bit line BL.

Figure 9:
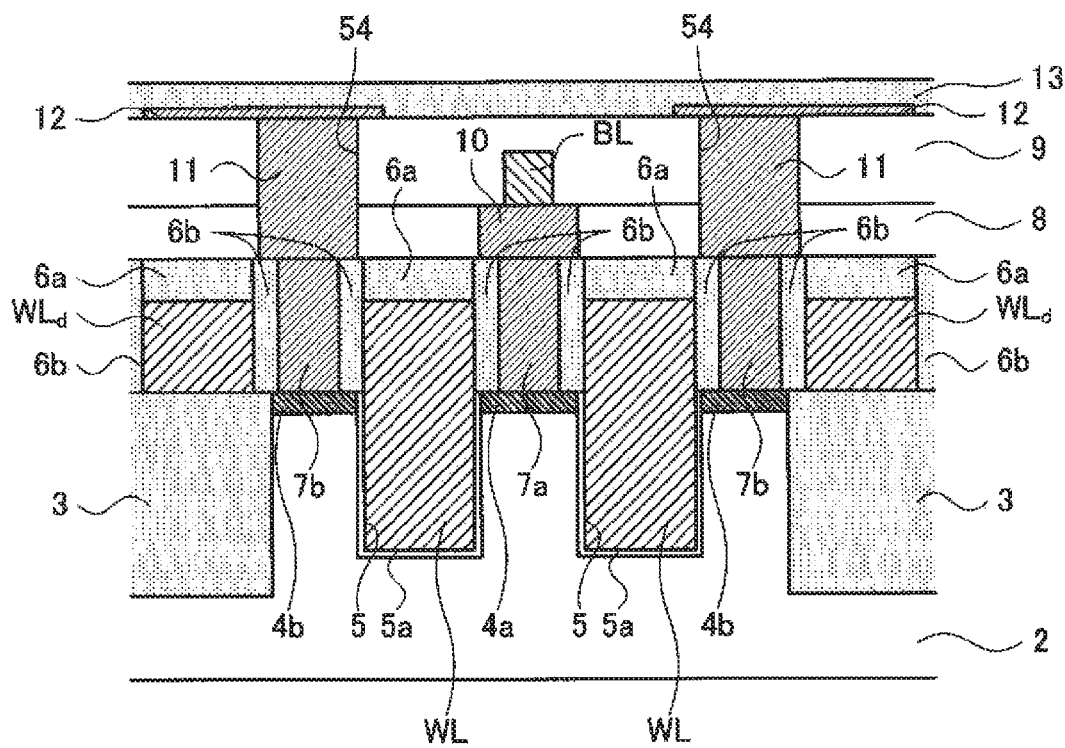
FIG. 9 is a cross-sectional view showing one of steps (from forming openings 54 to forming a third interlayer insulating film 13) of a manufacturing method of a semiconductor device according to a first embodiment of the present invention.

Next, as shown in FIG. 9, openings (contact holes) 54 piercing through the interlayer insulating films 8 and 9 are formed at positions of the substrate contact plugs 7b (positions of the substrate contacts Lb shown in FIG. 2), thereby exposing the surfaces of the substrate contact plugs 7b. The inside of the openings 54 is filled with a laminated film having a lamination of tungsten or the like on a barrier film made of a laminated film of titanium and titanium nitride, and the surface is polished by the CMP method, thereby forming the capacitance contact plug 11.

The capacitance contact pads 12 are then formed by using a laminated film containing tungsten, on the second interlayer insulating film 9. This capacitance contact pads 12 are arranged to be conductive to the capacitance contact plugs 11, and have a larger size than that of a bottom of the lower electrode (FIG. 1) of the capacitors 20 formed later. The third interlayer insulating film 13 is deposited by using silicon nitride to cover the capacitance contact pads 12. Preferably, the third interlayer insulating film 13 has a film thickness of about 60 nanometers.

Figure 10:
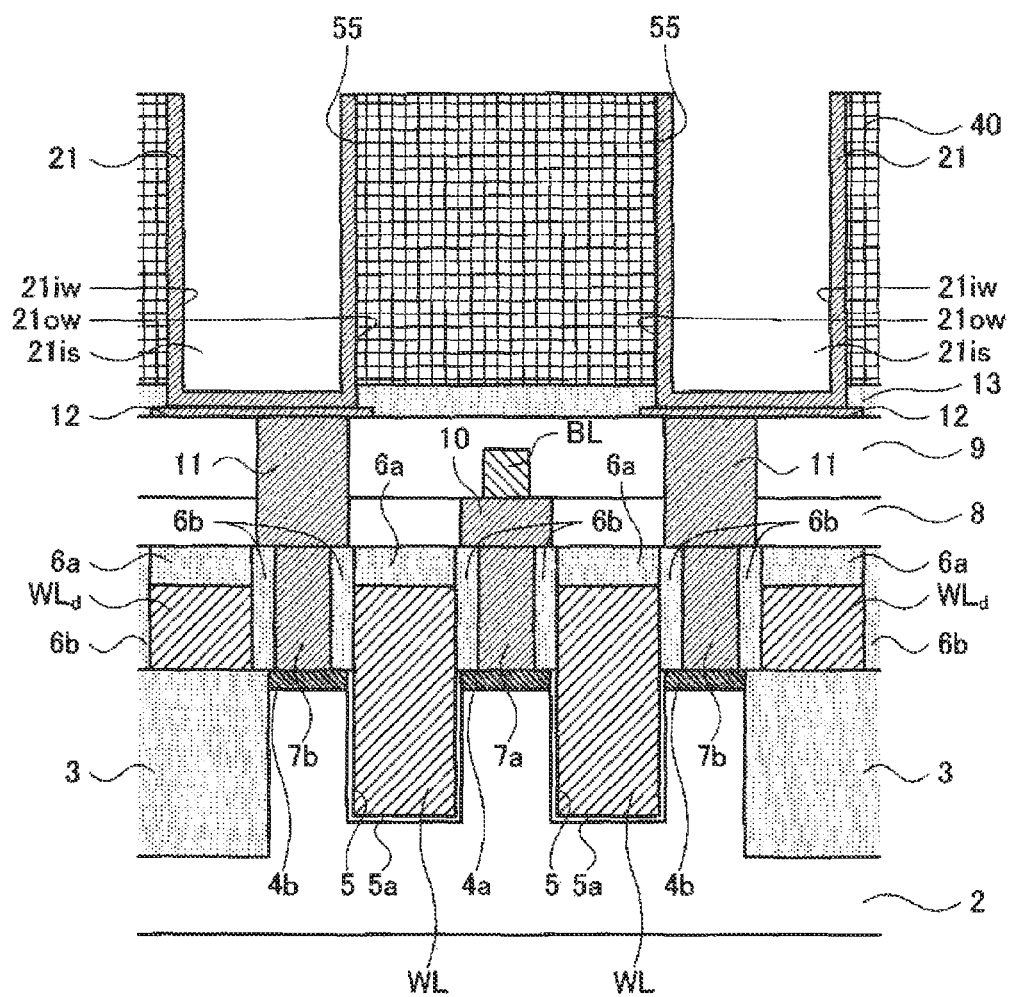
FIG. 10 is a cross-sectional view showing one of steps (from forming an interlayer insulating film 40 to forming lower electrodes 21) of a manufacturing method of a semiconductor device according to a first embodiment of the present invention.

An interlayer insulating film 40 shown in FIG. 10 is deposited next. This interlayer insulating film 40 is configured by an insulator having a relatively high etching speed to hydrofluoric acid (HF), such as silicon oxide. Preferably, the interlayer insulating film 40 has a film thickness of about 2 micrometers. Openings 55 are formed at positions where the lower electrodes 21 (FIGS. 1 and 3) of the capacitors 20 are formed, by anisotropic dry etching, thereby exposing a part of the surface of the capacitance contact pad 12.

After the openings 55 are formed, the cylindrical lower electrode 21 having the internal wall 21iw and the external wall 21ow is formed in each of the openings 55. Specifically, titanium nitride is deposited in a film thickness not to completely fill the inside of the openings 55. Titanium nitride deposited on the interlayer insulating film 40 is removed by dry etching or by the CMP method. To protect the titanium nitride inside the openings (titanium nitride that becomes the lower electrode 21), a photoresist film or the like can be buried in the openings beforehand. In this case, after titanium nitride on the interlayer insulating film 40 is removed, the film buried beforehand to protect the inside is also removed. A metal film other than titanium nitride can be also used for a material of the lower electrode 21.

Figure 11:
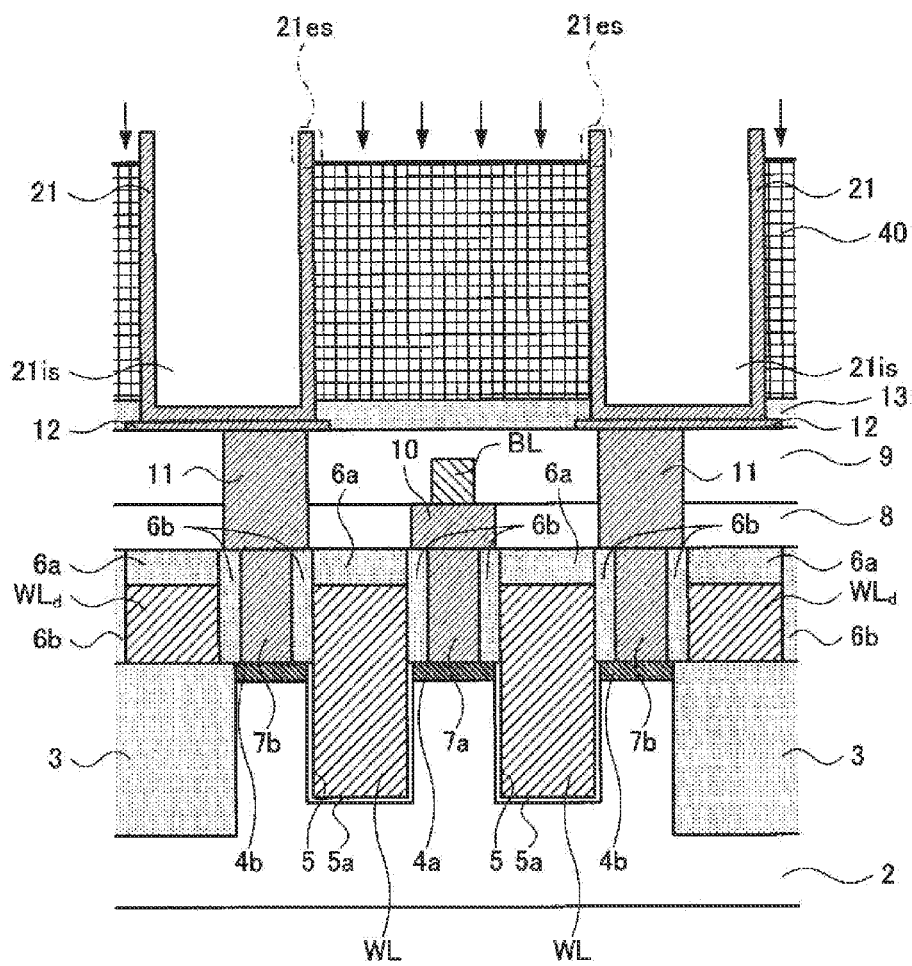
FIG. 11 is a cross-sectional view showing one of steps (etching back the interlayer insulating film 40) of a manufacturing method of a semiconductor device according to a first embodiment of the present invention.

Next, as shown in FIG. 11, a part of the interlayer insulating film 40 is etched back by wet etching using hydrofluoric acid (HF), thereby removing a part of the surface (film thickness of about 40 to 100 nanometers). As a result, the upper end 21es (the upper end region) of the lower electrode 21 projects from the surface of the interlayer insulating film 40. With this, the external wall 21iw of the upper end region of the lower electrode 21 exposes.

Figure 12:
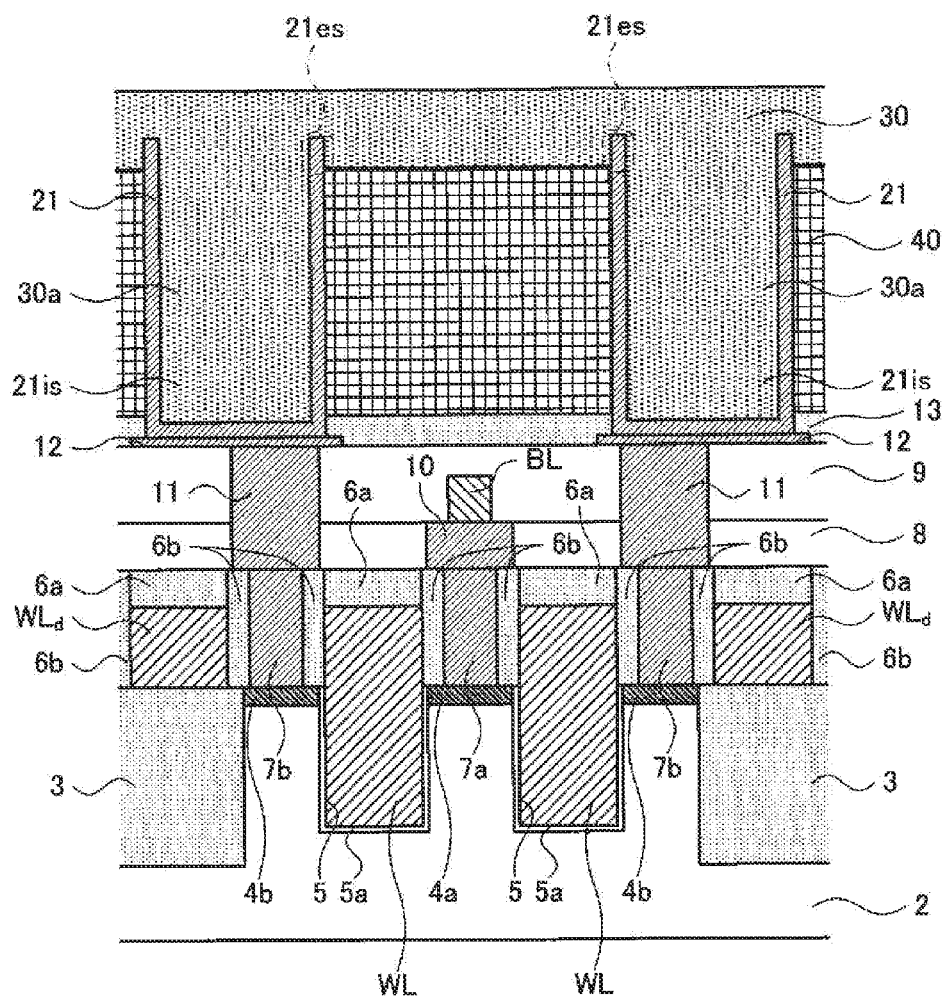
FIG. 12 is a cross-sectional view showing one of steps (depositing a supporting film 30) of a manufacturing method of a semiconductor device according to a first embodiment of the present invention.

As shown in FIG. 12, the supporting film 30 is then deposited in the internal region 21is of the lower electrode 21 and on an upper surface of the interlayer insulating film 40. That is, the supporting film 30 is then formed such as filling into a center region surrounded by the internal wall of the lower electrode 21. This supporting film 30 is configured by an insulator having a relatively low etching speed to hydrofluoric acid (HF), such as silicon nitride. A large part of the supporting film 30 deposited in the internal region 21is of the lower electrode 21 constitutes the buried portion 30a.

Figure 13:
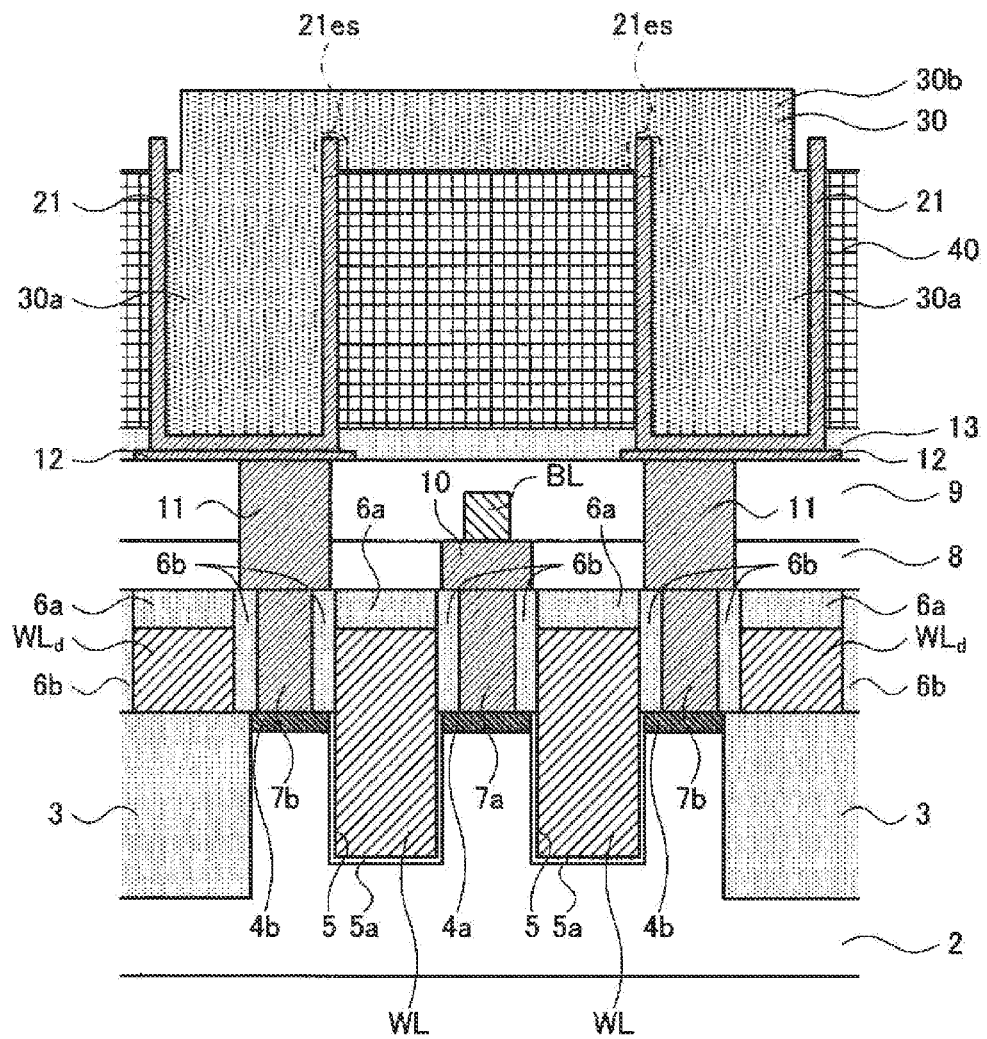
FIG. 13 is a cross-sectional view showing one of steps (patterning the supporting film 30) of a manufacturing method of a semiconductor device according to a first embodiment of the present invention.

After the supporting film 30 is deposited as described above, an upper part of the supporting film 30 is patterned as shown in FIG. 13, thereby forming the supporting portion 30b extended to a predetermined direction (the X direction shown in FIG. 3). Preferably, anisotropic dry etching is used for this patterning. Specifically, a mask pattern is formed with photoresist to leave the supporting portion 30b of the shape shown in FIG. 3, thereby etching the supporting film 30.

As described above, the supporting portion 30b sandwiches the upper end 21es of the lower electrode 21 at both sides of the upper end. In the first embodiment, this is achieved by removing a part of the surface by etching back the interlayer insulating film 40 by wet etching, as explained with reference to FIG. 11.

Figure 14:
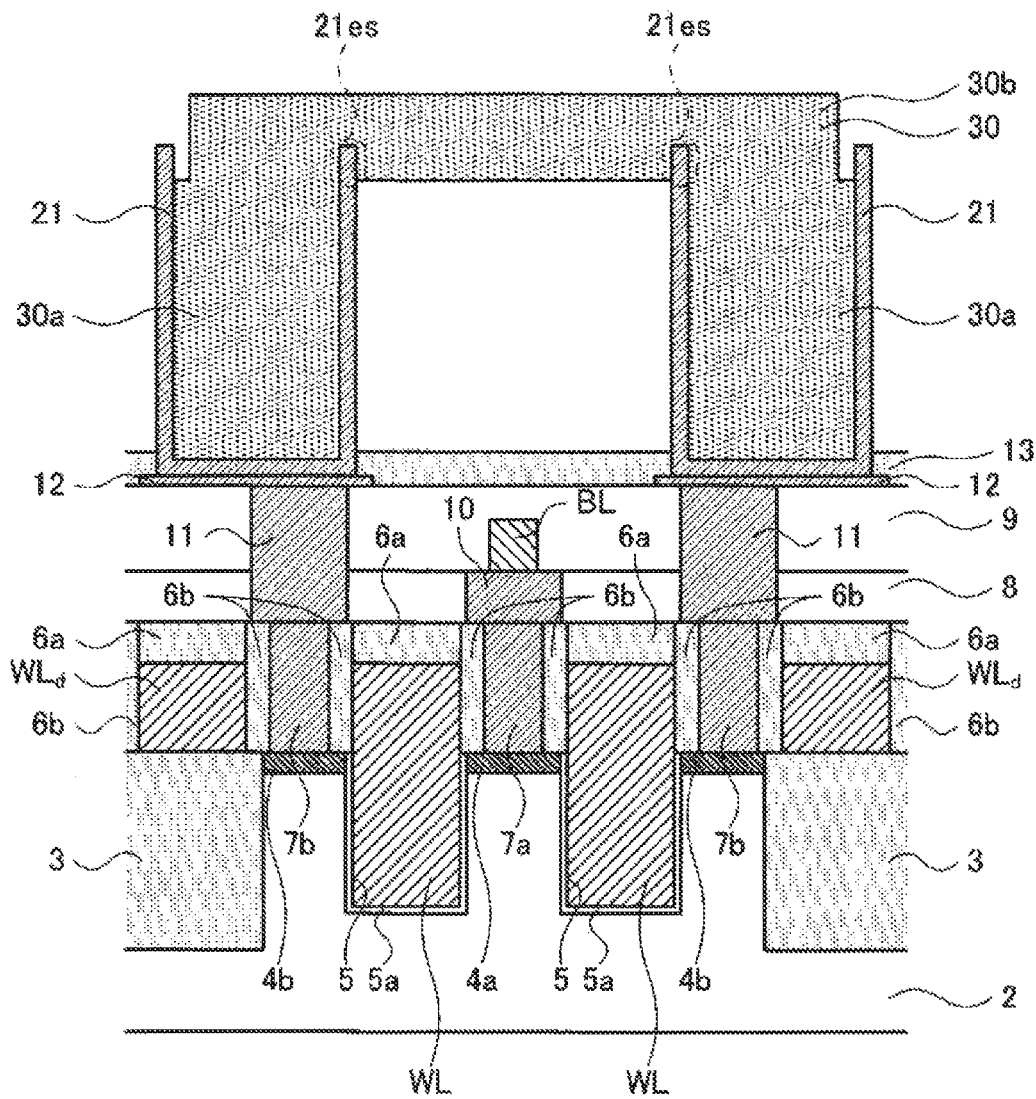
FIG. 14 is a cross-sectional view showing one of steps (removing the interlayer insulating film 40) of a manufacturing method of a semiconductor device according to a first embodiment of the present invention.

Next, as shown in FIG. 14, the interlayer insulating film 40 is removed by wet etching using hydrofluoric acid (HF), thereby exposing the external wall of the lower electrode 21. In this case, the third interlayer insulating film 13 formed by the same material as that of the supporting film 30, that is, silicon nitride, functions as a stopper film, and prevents elements positioned in a lower layer from being etched. In forming the supporting portion 30b by patterning an upper part of the supporting film 30, preferably, the supporting film 30 is left in regions other than the memory cell region. With this arrangement, at the time performing wet etching to remove the interlayer insulating film 40, regions other than the memory cell region can be prevented from being eroded by hydrofluoric acid (HF).

The supporting film 30 is also gradually etched by the wet etching. As described above, a material of the supporting film 30 is an insulator having a relatively low etching speed to hydrofluoric acid (HF). Although the supporting film 30 has a smaller etching speed than that of the interlayer insulating film 40 configured by an insulator having a relatively high etching speed to hydrofluoric acid (HF), the supporting film 30 is also gradually etched, instead of not being etched at all.

However, because the supporting portion 30b of the supporting film 30 has a structure of sandwiching the upper end 21es of the lower electrode 21 at both sides of the upper end 21es, the supporting portion 30b and the buried portion 30a are kept fixed strongly during a relatively long time of wet etching. Therefore, in the middle of the manufacturing step of the semiconductor device 1 in a state shown in FIG. 14 (a state that the interlayer insulating film 40 is removed, and the external wall of the cylindrical lower electrode 21 is exposed), the lower electrode 21 can be prevented from being collapsed.

Next, as shown in FIG. 1, the capacitance dielectric film 22 that covers the exposed surface of the lower electrode 21 is formed, and the upper electrode 23 configured by titanium nitride is formed. Specifically, after titanium nitride is formed in a thin film shape to cover the surface of the capacitance dielectric film 22, a polycrystalline silicon film having impurity introduced therein is deposited to fill a gap between the adjacent lower electrodes 21, thereby forming the upper electrode 23. To decrease electric resistance, a metal film such as tungsten can be further laminated on the polycrystalline silicon film constituting the upper electrode 23. As a result, a structure of sandwiching the capacitance dielectric film 22 by the lower electrode 21 and the upper electrode 23 is completed, thereby forming the capacitor 20.

Thereafter, the fourth interlayer insulating film 14 made of silicon oxide or the like is formed. Although not shown, openings are provided in the fourth interlayer insulating film 14, and a drawing contact plug to be connected to the upper electrode 23 is formed within the openings. This drawing contact plug is used to give a potential (a plate potential) to the upper electrode 23. The wiring layer 15 is formed by aluminum (Al) or copper (Cu), on the upper surface of the fourth interlayer insulating film 14. The protection film 16 of the surface is formed by silicon nitride (SiON) or the like, thereby completing the memory cell region of the semiconductor device 1.

As described above, according to the semiconductor device 1, even after performing the wet etching to remove the interlayer insulating film 40, the state that the supporting portion 30b and the buried portion 30a are strongly fixed is maintained. Therefore, occurrence of the collapse phenomenon of the lower electrode 21 can be suppressed. Consequently, even when downscaling of the memory cell is advanced, an electrostatic capacitance of the cell capacitor can be secured, and a DRAM having a large capacity and excellent in a data holding characteristic (a refresh characteristic) can be manufactured.

According to the semiconductor device 1, an entire surface (an internal surface) of the internal wall 21iw of the lower electrode 21 cannot be used as an electrode, because the internal region 21is of the lower electrode 21 is filled with the supporting film 30. Therefore, the electrostatic capacitance of the capacitor 20 decreases as compared with an electrostatic capacitance when the internal surface is also used for an electrode. However, because both the supporting portion 30b and the buried portion 30a are strongly fixed, the lower electrode 21 can be set higher. Consequently, reduction of the electrostatic capacitance by not using the internal surface as an electrode can be compensated for by increasing a surface area of the external surface.

While the semiconductor device according to the first embodiment has been explained above, various modifications of the semiconductor device 1 can be considered. One example of the modifications is described below in detail.

As explained with reference to FIG. 11, in the first embodiment, wet etching is used to stretch the upper end portion of the lower electrode 21 from the surface of the interlayer insulating film 40. Alternatively, dry etching can be used to remove titanium nitride deposited at the time of forming the lower electrode 21, and the upper end portion of the lower electrode 21 can be stretched from the surface of the interlayer insulating film 40, by over-etching. In this case, the interlayer insulating film 40 can be efficiently removed by changing a gas condition at a stage of approximately removing titanium nitride. With the above arrangement, one step of wet etching can be omitted. Accordingly, the semiconductor device 1 can be manufactured efficiently by reducing the number of manufacturing steps.

The semiconductor device 1 according to a second embodiment of the present invention is explained next. The semiconductor device 1 according to the second embodiment is different from the semiconductor device 1 according to the first embodiment in that a part of a manufacturing step in the second embodiment is different from that in the first embodiment. Specifically, a forming method of the supporting film is different between the first and second embodiments. This difference is mainly explained with reference to FIGS. 15 to 19.

Figure 15:
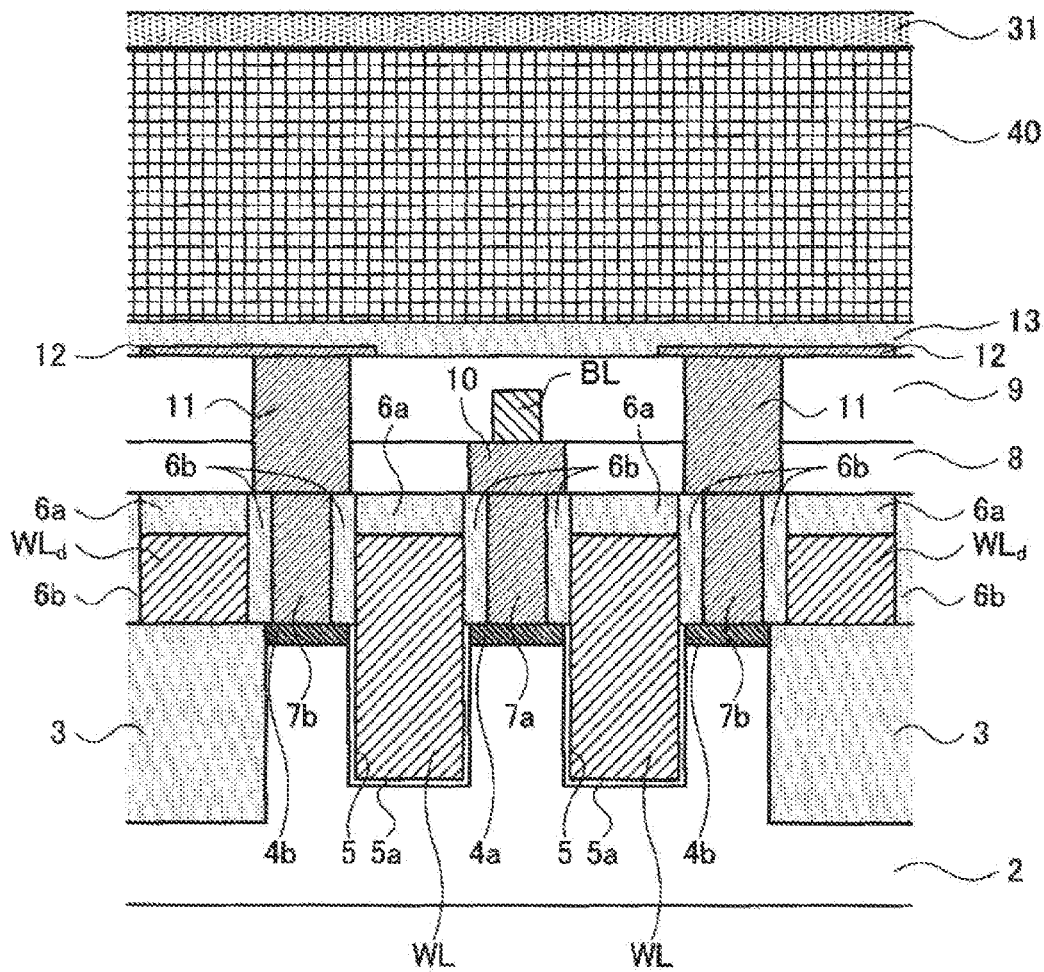
FIG. 15 is a cross-sectional view showing one of steps (depositing a first supporting film 31) of a manufacturing method of a semiconductor device according to a second embodiment of the present invention.

As shown in FIG. 15, films up to the interlayer insulating film 40 are formed in a similar manner to that in the first embodiment (middle in FIG. 10), and the first supporting film 31 (film thickness of about 40 to 100 nanometers) made of silicon nitride is formed on the upper surface of the interlayer insulating film 40.

Figure 16:
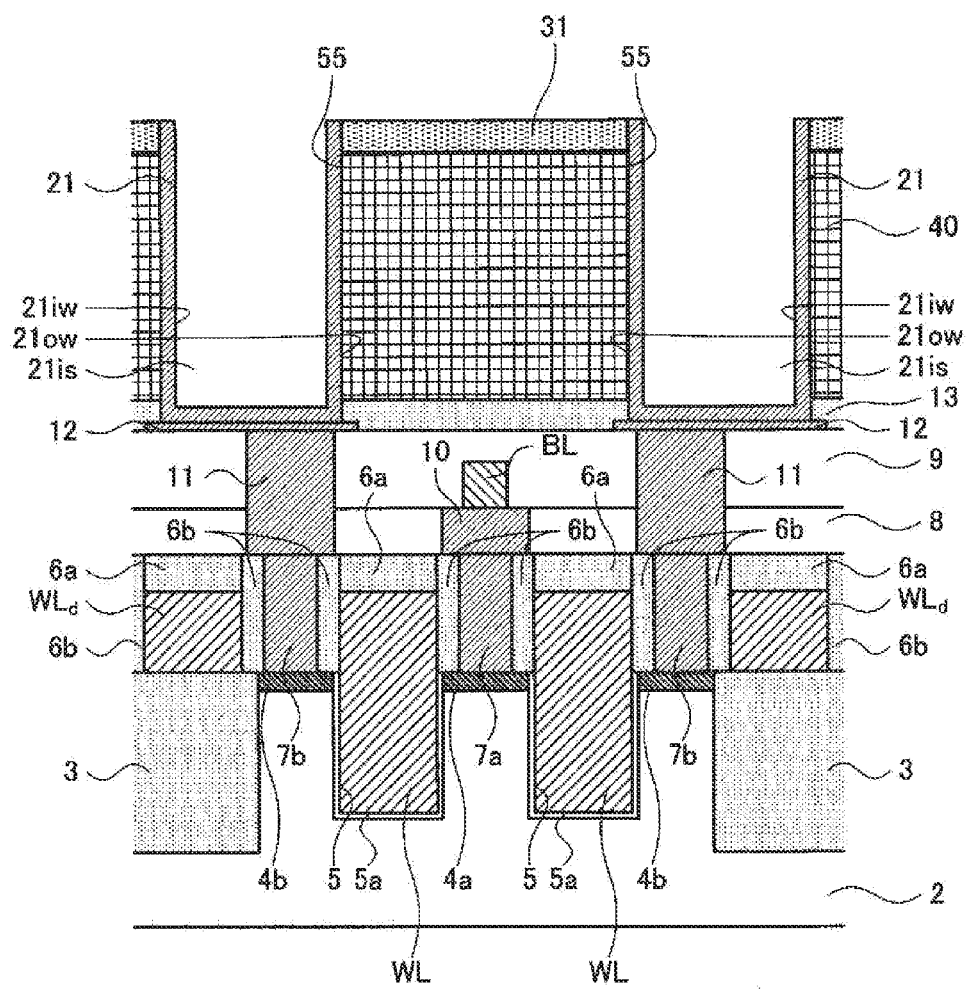
FIG. 16 is a cross-sectional view showing one of steps (from forming openings 55 to forming lower electrodes 21) of a manufacturing method of a semiconductor device according to a second embodiment of the present invention.

As shown in FIG. 16, the openings 55 piercing through the first supporting film 31 and through the interlayer insulating film 40 are formed by anisotropic dry etching, thereby exposing a part of the surface of the capacitance contact pad 12. The cylindrical lower electrode 21 having the internal wall 21iw and the external wall 21ow is formed on each internal wall of the opening 55, in a similar manner to that of the first embodiment. The external wall 21ow of the upper end 21es of the lower electrode 21 formed in this way is covered by the first supporting film 31.

Figure 17:
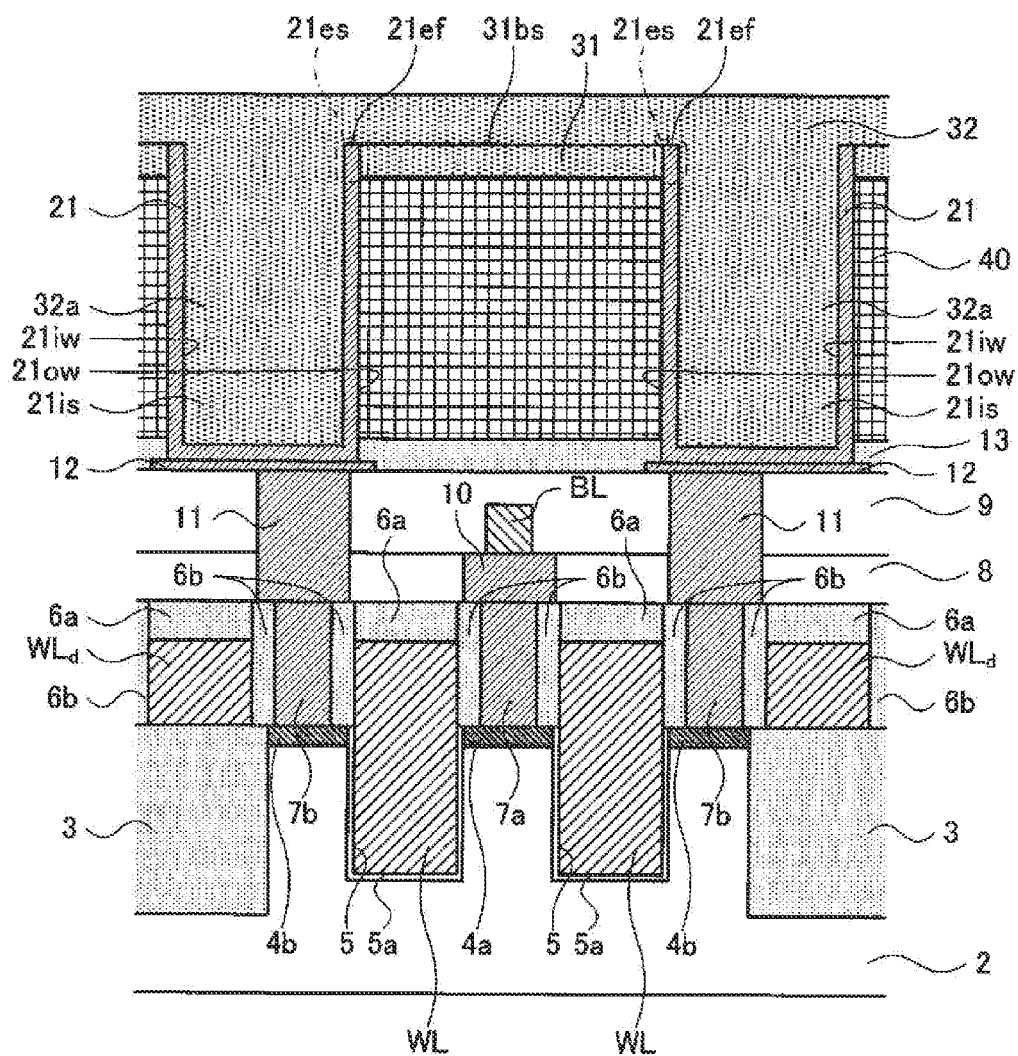
FIG. 17 is a cross-sectional view showing one of steps (depositing a second supporting film 32) of a manufacturing method of a semiconductor device according to a second embodiment of the present invention.

As shown in FIG. 17, a second supporting film 32 made of silicon nitride is deposited in the internal region 21is of the lower electrode 21 and on the upper surface of the interlayer insulating film 40. Accordingly, an upper end surface of the lower electrode 21 is configured to be flush with a boundary surface 31bs of the first supporting film 31 and the second supporting film 32. That is, an upper end surface of the lower electrode 21 and a boundary surface 31bs between the first supporting film 31 and the second supporting film 32 are disposed at substantially same level. A large part of the second supporting film 32 deposited in the internal region 21is of the lower electrode 21 becomes a buried portion 32a. The internal wall 21iw of the upper end 21es of the lower electrode 21 is covered by the second supporting film 32. Therefore, the upper end 21es of the lower electrode 21 is sandwiched by the first and second supporting films 31 and 32 at both sides of the upper end 21es.

Figure 18:
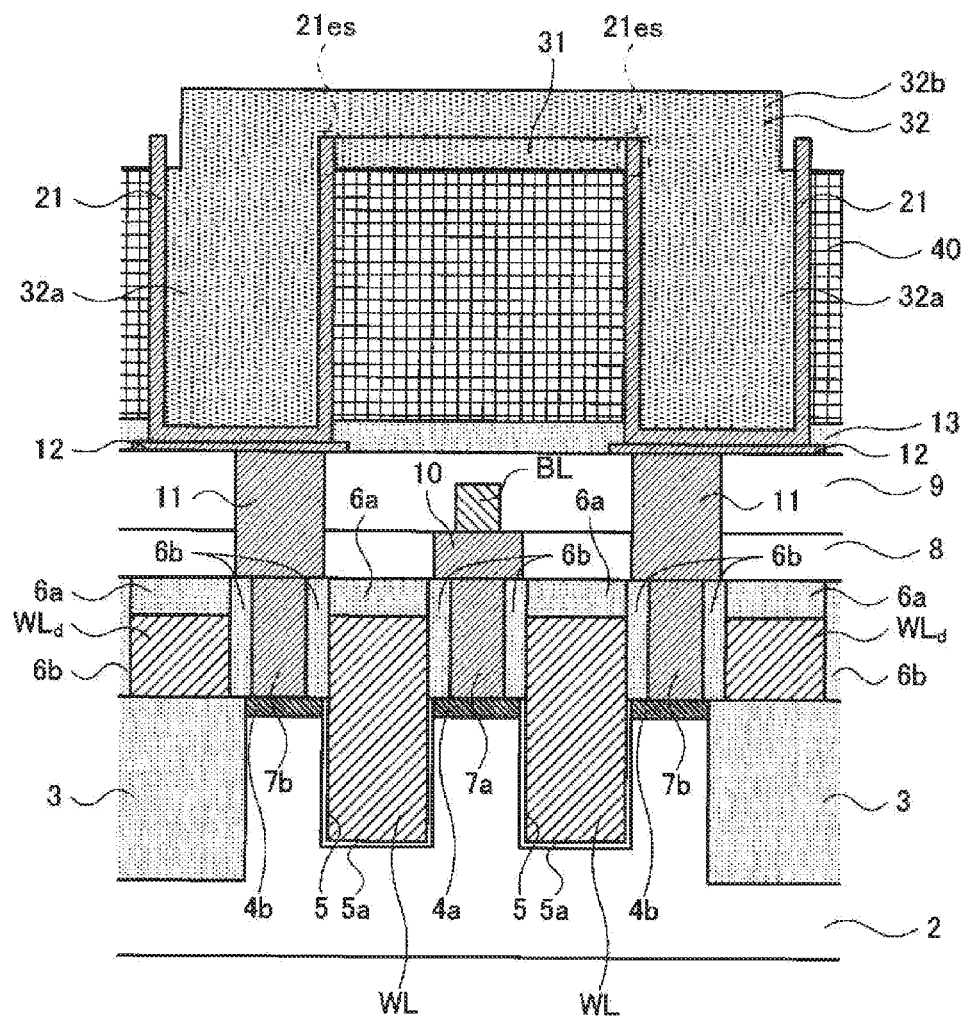
FIG. 18 is a cross-sectional view showing one of steps (patterning the supporting films 31, 32) of a manufacturing method of a semiconductor device according to a second embodiment of the present invention.

Thereafter, as shown in FIG. 18, the supporting films 31 and 32 are patterned by anisotropic etching, thereby forming the supporting portion 32b. The supporting portion 32b formed in this way sandwiches the upper end 21es of the lower electrode 21 at both sides of the upper end 21es. The supporting portion 32b has a two-layer structure of the first and second supporting films 31 and 32. A layout pattern of the supporting portion 32b is identical to that of the supporting portion 30b according to the first embodiment. Because both the supporting films 31 and 32 are formed by silicon nitride, these supporting films are integrated. While FIG. 18 and other diagrams clearly show the boundary, boundary surfaces are not that clear in practice.

Figure 19:
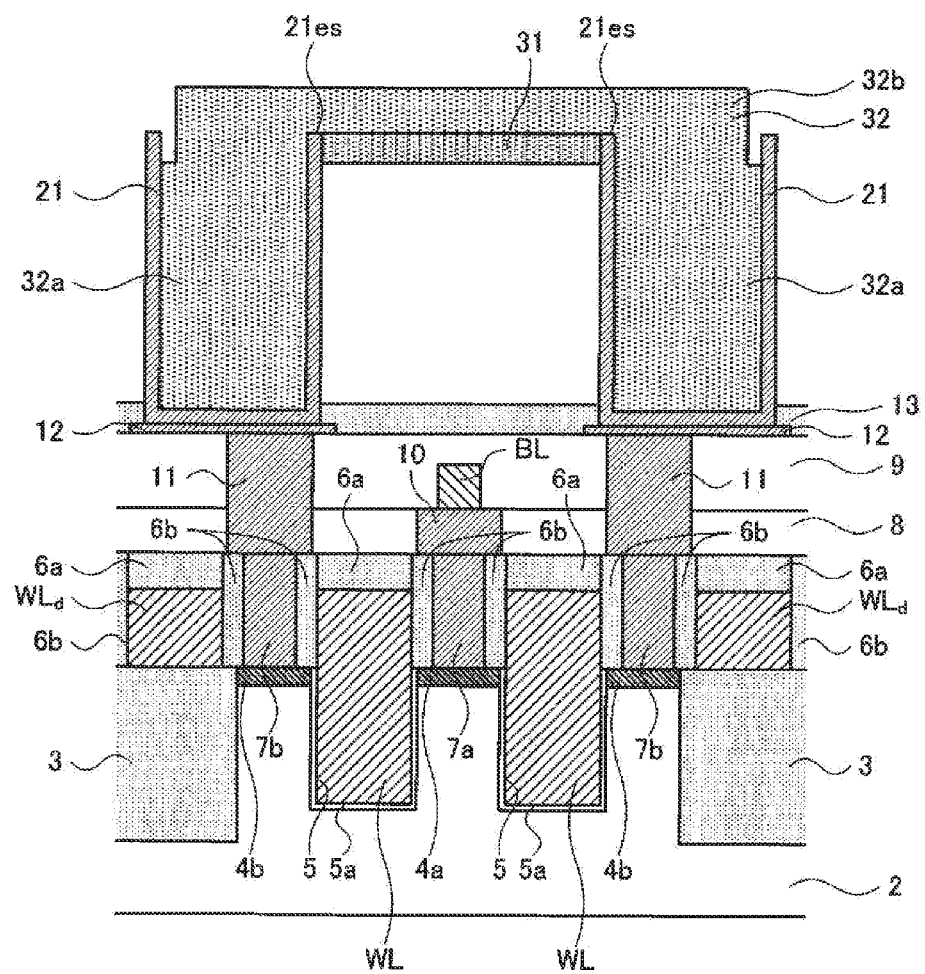
FIG. 19 is a cross-sectional view showing one of steps (removing the interlayer insulating film 40) of a manufacturing method of a semiconductor device according to a second embodiment of the present invention.

As shown in FIG. 19, the interlayer insulating film 40 is removed by wet etching using hydrofluoric acid, thereby exposing the external wall of the lower electrode 21. Subsequent steps are identical to those in the first embodiment.

As described above, the semiconductor device 1 according to the second embodiment can also keep a state that the supporting portion 30b and the buried portion 30a are strongly fixed, even after performing the wet etching to remove the interlayer insulating film 40, in a similar manner to that of the semiconductor device 1 according to the first embodiment. Therefore, the occurrence of the collapse phenomenon of the lower electrode 21 can be suppressed. An etch-back step of the interlayer insulating film 40 necessary at the first step becomes unnecessary.

The semiconductor device 1 according to a third embodiment of the present invention is explained next. The semiconductor device 1 according to the third embodiment is different from the semiconductor device 1 according to the first embodiment in that a lower electrode of a capacitor has a two-tier structure. This difference is mainly explained with reference to FIGS. 20 to 23. A portion positioned in a lower layer by the capacitance contact pad 12 is not shown in FIGS. 20 to 23.

Figure 20:
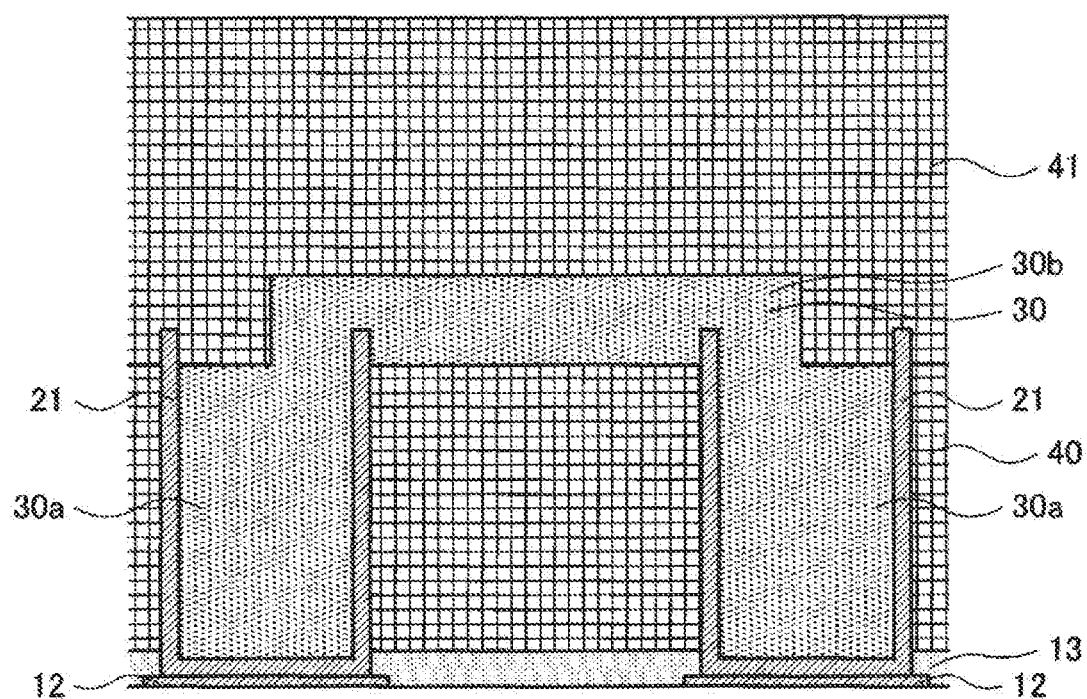
FIG. 20 is a cross-sectional view showing one of steps (forming an interlayer insulating film 41) of a manufacturing method of a semiconductor device according to a third embodiment of the present invention.

First, as shown in FIG. 20, portions up to the supporting portion 30b of the supporting film 30 are formed in a similar manner to that in the first embodiment (FIG. 13). Thereafter, an interlayer insulating film 41 (having a film thickness of about 2 micrometers) made of silicon oxide or the like is formed on the interlayer insulating film 40 and the supporting portion 30b.

Figure 21:
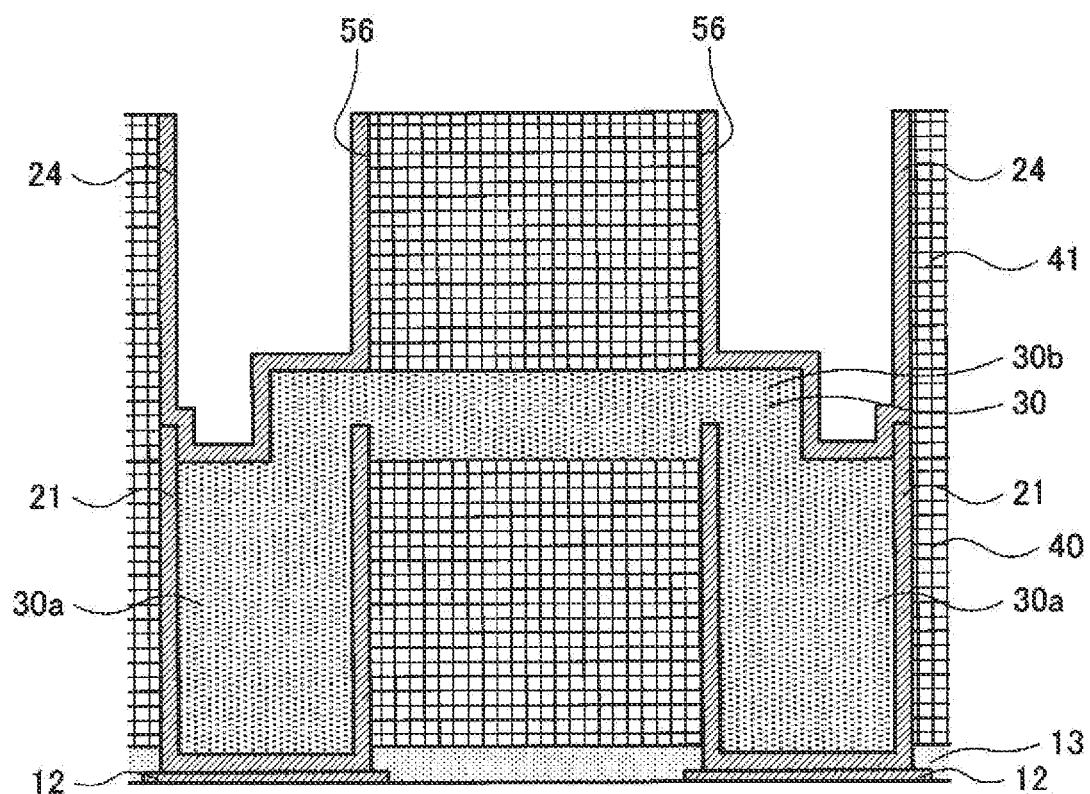
FIG. 21 is a cross-sectional view showing one of steps (from forming openings 56 to forming lower electrodes 24) of a manufacturing method of a semiconductor device according to a third embodiment of the present invention.

Next, as shown in FIG. 21, openings 56 piercing through the interlayer insulating film 41 are formed at positions corresponding to the lower electrode 21 as a lower electrode of a first layer, by anisotropic dry etching, thereby exposing a part of the lower electrode 21 and the supporting film 30. A selection ratio by dry etching of silicon nitride constituting the interlayer insulating film 41 and silicon nitride constituting the supporting film 30 needs to be adjusted, to properly leave the supporting film 30 positioned at a lower part of the openings 56 by this anisotropic dry etching.

Thereafter, the lower electrode 24 as a lower electrode of a second layer is formed on an internal wall of the openings 56, at a step identical to that of forming the lower electrode 21 according to the first embodiment. The lower electrodes 21 and 24 are partly in contact with each other, and function as one lower electrode.

Figure 22:
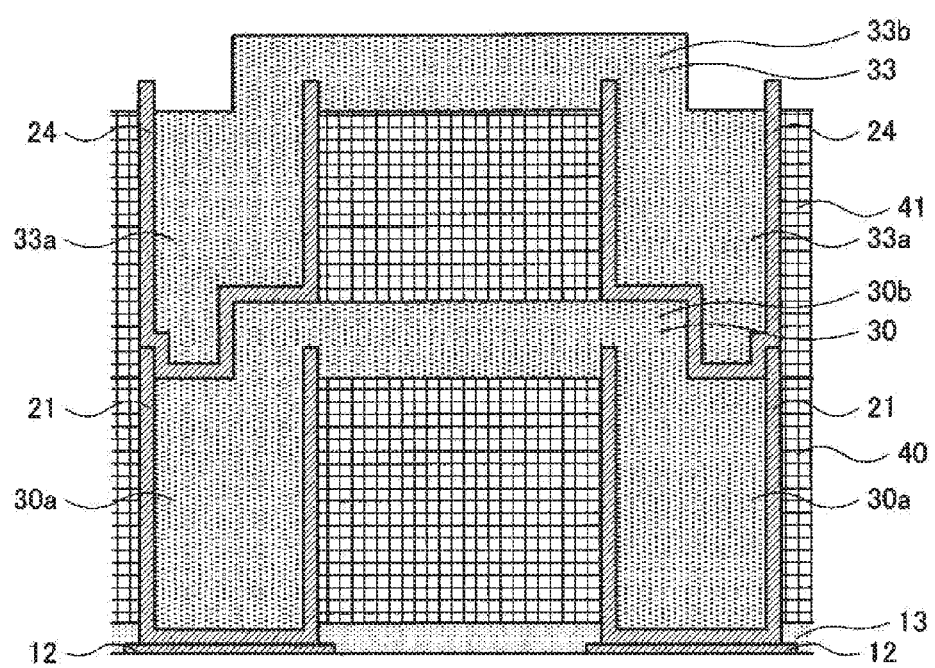
FIG. 22 is a cross-sectional view showing one of steps (from depositing a supporting film 33 to patterning the supporting film 33) of a manufacturing method of a semiconductor device according to a third embodiment of the present invention.

Next, as shown in FIG. 22, a supporting film 33 made of silicon nitride is deposited within the lower electrode 24 and on the interlayer insulating film 41 at a step identical to that of depositing and forming the supporting film 30 according to the first embodiment. Consequently, a buried portion 33a buried within the lower electrode 24, and a supporting portion 33b extended to a predetermined direction are formed.

Figure 23:
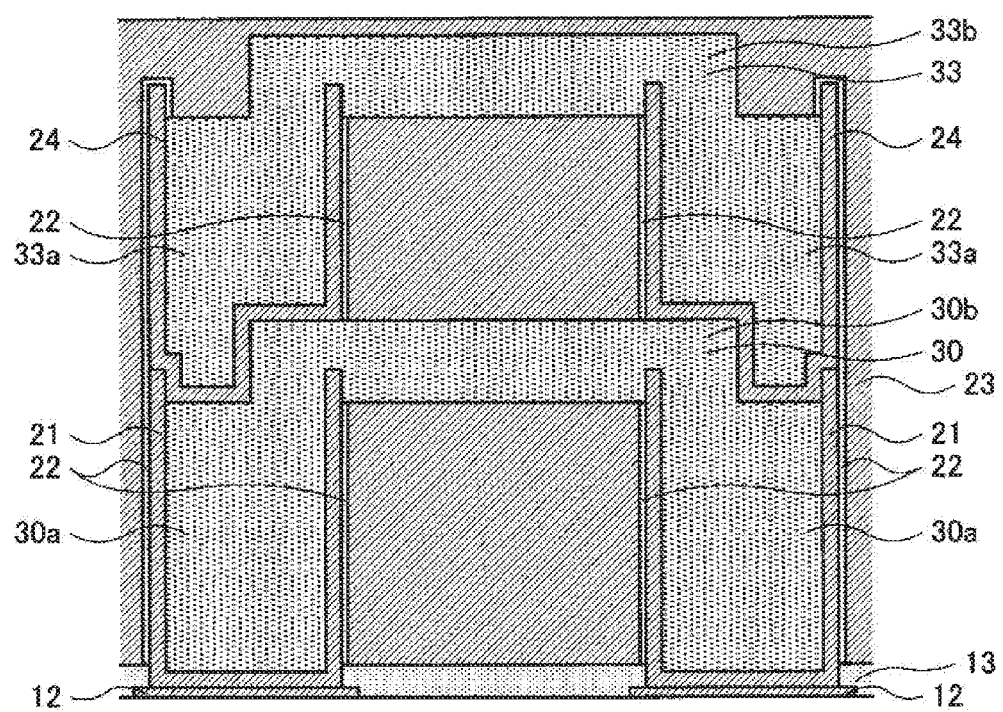
FIG. 23 is a cross-sectional view showing one of steps (from removing the interlayer insulating films 40, 41 to forming upper electrodes 23) of a manufacturing method of a semiconductor device according to a third embodiment of the present invention.

As shown in FIG. 23, the interlayer insulating films 40 and 41 are removed by wet etching using hydrofluoric acid, thereby exposing external walls of the lower electrodes 21 and 24. Further, the capacitance dielectric film 22 and the upper electrode 23 are formed in a similar manner to that in the first embodiment.

As described above, in the semiconductor device 1 according to the third embodiment, the lower electrode has a two-tier laminated structure. Therefore, a larger electrostatic capacitance of a capacitor can be secured. Because both the lower electrodes 21 and 24 are supported by a supporting film, the occurrence of the collapse phenomenon of the lower electrode can be suppressed more than that when the lower electrode is set high in a one-tier structure.

While the lower electrode is provided with a two-tier structure in the third embodiments, it is obvious that the laminated structure of the lower electrode can be three or more tiers.

It is apparent that the present invention is not limited to the above embodiments, but may be modified and changed without departing from the scope and spirit of the invention.

For example, while a MOS transistor having a trench gate electrode (the word line WL) is used in the above embodiments, the present invention can be also applied to a semiconductor device using a planar MOS transistor or a MOS transistor having a channel region formed on a side surface of a trench provided on a semiconductor substrate.

What is claimed is:
1. A semiconductor device comprising:
a semiconductor substrate;
a first cylindrical lower electrode formed over the semiconductor substrate;
a first insulating supporting film configured to support the first cylindrical lower electrode;
a second cylindrical lower electrode formed on the first cylindrical lower electrode;
a second insulating supporting film configured to support the second cylindrical lower electrode;
a dielectric film formed on external walls of the first and second cylindrical lower electrodes; and
an upper electrode formed on the dielectric film.
2. The semiconductor device as claimed in claim 1, wherein
the first insulating supporting film is buried inside the first cylindrical lower electrode.
3. The semiconductor device as claimed in claim 1, wherein
the first insulating supporting film includes a structure which sandwiches an internal wall and the external wall of the first cylindrical lower electrode.
4. The semiconductor device as claimed in claim 1, wherein
the second insulating supporting film is buried inside the second cylindrical lower electrode.

5. The semiconductor device as claimed in claim 1, wherein
the second insulating supporting film includes a structure which sandwiches an internal wall and the external wall of the second cylindrical lower electrode.

6. The semiconductor device as claimed in claim 1, wherein
the upper electrode is formed on an internal wall of the second cylindrical lower electrode.

7. The semiconductor device as claimed in claim 1, further comprising:
an interlayer insulating film that covers the external wall of a lower end region of the first cylindrical lower electrode, wherein
the interlayer insulating film and the first and second insulating supporting films are made of a same material.

8. A semiconductor device comprising:
a semiconductor substrate;
an insulating layer formed over the semiconductor substrate;
a first contact plug formed in the insulating layer therethrough;
a second contact plug formed in the insulating layer therethrough;
a metal layer formed in the insulating layer and arranged between the first and second contact plugs;
a first cylindrical lower electrode formed on the first contact plug;
a second cylindrical lower electrode formed on the second contact plug;
a first insulating supporting film configured to support the first and second cylindrical lower electrodes;
a third cylindrical lower electrode formed on the first cylindrical lower electrode;
a fourth cylindrical lower electrode formed on the second cylindrical lower electrode;
a second insulating supporting film configured to support the third and fourth cylindrical lower electrodes; and
a dielectric film formed on external walls of the first to fourth cylindrical lower electrodes; and
an upper electrode formed on the dielectric film.

9. The semiconductor device as claimed in claim 8, wherein
the first insulating supporting film is buried inside the first and second cylindrical lower electrodes.

10. The semiconductor device as claimed in claim 8, wherein
the first insulating supporting film includes a structure which sandwiches an internal wall and the external wall of the first cylindrical lower electrode, and further sandwiches an internal wall and the external wall of the second cylindrical lower electrode.

11. The semiconductor device as claimed in claim 8, wherein
the second insulating supporting film is buried inside the third and fourth cylindrical lower electrodes.

12. The semiconductor device as claimed in claim 8, wherein
the second insulating supporting film includes a structure which sandwiches an internal wall and the external wall of the third cylindrical lower electrode, and further sandwiches an internal wall and the external wall of the fourth cylindrical lower electrode.

13. The semiconductor device as claimed in claim 8, wherein
the upper electrode is formed on an internal wall of the third and fourth cylindrical lower electrodes via the dielectric film.

14. The semiconductor device as claimed in claim 8, further comprising:
an interlayer insulating film that covers the external wall of a lower end region of the first cylindrical lower electrode, wherein
the interlayer insulating film and the first and second insulating supporting film are made of a same material.

15. A semiconductor device comprising:
a plurality of capacitors formed over a semiconductor substrate, each of the plurality of capacitors including,
a plurality of cylindrical lower electrodes stacked with each other over the semiconductor substrate, the cylindrical lower electrode having an internal wall and an external wall,
a dielectric film formed on the external wall of the cylindrical lower electrode, and
an upper electrode formed on the dielectric film; and
a plurality of insulating supporting films each positioned at outside of the respective one of the plurality of cylindrical lower electrode stacked with each other,
each of the plurality of insulating supporting films bridging the plurality of capacitors.

16. The semiconductor device as claimed in claim 15, wherein
the plurality of insulating supporting films are positioned at inside of the respective one of the plurality of cylindrical lower electrode stacked with each other.

17. The semiconductor device as claimed in claim 15, wherein
a quarter or more of an entire peripheral length of the external wall of the lower electrode in plan view is continuously in contact with the respective insulating supporting film.

18. The semiconductor device as claimed in claim 15, further comprising:
an interlayer insulating film that covers the external wall of a lower end region of the lower electrode, wherein
the interlayer insulating film and the plurality of insulating supporting films are made of a same material.

19. The semiconductor device as claimed in claim 15, wherein
at least one of the plurality of insulating supporting films comprises a first supporting film and a second supporting film, the first supporting film contacting to the external wall of the upper end region of the lower electrode, the second supporting film contacting to the internal wall of the upper end region of the lower electrode, and the upper end region of the lower electrode being sandwiched by the first supporting film and the second supporting film.

20. The semiconductor device as claimed in claim 15, wherein
the upper electrode is formed on an internal wall of the cylindrical lower electrode which is positioned at a top among the plurality of cylindrical lower electrodes.

* * * * *